(12) United States Patent
Yamazaki et al.

(10) Patent No.: US 7,608,490 B2
(45) Date of Patent: Oct. 27, 2009

(54) SEMICONDUCTOR DEVICE AND MANUFACTURING METHOD THEREOF

(75) Inventors: Shunpei Yamazaki, Setagaya (JP); Tetsuya Kakehata, Isehara (JP); Hideto Ohnuma, Atsugi (JP); Masaharu Nagai, Atsugi (JP); Mitsuaki Osame, Atsugi (JP); Masayuki Sakakura, Isehara (JP); Shigeki Komori, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 350 days.

(21) Appl. No.: 11/440,175

(22) Filed: May 25, 2006

(65) Prior Publication Data

US 2006/0275710 A1    Dec. 7, 2006

(30) Foreign Application Priority Data

Jun. 2, 2005    (JP) ............................ 2005-162308

(51) Int. Cl.
  *H01L 21/00* (2006.01)
(52) U.S. Cl. .................. 438/149; 257/59; 257/291; 438/151; 349/42; 349/43; 349/44; 349/45; 349/47
(58) Field of Classification Search .......... 257/E29.279, 257/59, 291; 438/149, 151; 349/42–47
See application file for complete search history.

(56) References Cited

U.S. PATENT DOCUMENTS

| | | | |
|---|---|---|---|
| 6,521,912 B1 | 2/2003 | Sakama et al. | |
| 6,624,864 B1 * | 9/2003 | Kubo et al. | 349/139 |
| 6,809,023 B2 * | 10/2004 | Arai et al. | 438/623 |
| 6,818,852 B2 | 11/2004 | Ohmi et al. | |
| 6,919,282 B2 | 7/2005 | Sakama et al. | |
| 7,226,848 B2 * | 6/2007 | Sugawara et al. | 438/475 |

(Continued)

FOREIGN PATENT DOCUMENTS

EP    1505641    2/2005

(Continued)

OTHER PUBLICATIONS

Office Action (Chinese Patent Application No. 200610092457.5) Dated Feb. 27, 2009.

*Primary Examiner*—David Vu
*Assistant Examiner*—Brandon Fox
(74) *Attorney, Agent, or Firm*—Eric J. Robinson; Robinson Intellectual Property Law Office, P.C.

(57) ABSTRACT

To provide a semiconductor device having a circuit with high operating performance and high reliability, and improve the reliability of the semiconductor device, thereby improving the reliability of an electronic device having the same. The aforementioned object is achieved by combining a step of crystallizing a semiconductor layer by irradiation with continuous wave laser beams or pulsed laser beams with a repetition rate of 10 MHz or more, while scanning in one direction; a step of photolithography with the use of a photomask or a leticle including an auxiliary pattern which is formed of a diffraction grating pattern or a semi-transmissive film having a function of reducing the light intensity; and a step of performing oxidation, nitridation, or surface-modification to the surface of the semiconductor film, an insulating film, or a conductive film, with high-density plasma with a low electron temperature.

14 Claims, 22 Drawing Sheets

U.S. PATENT DOCUMENTS

| | | |
|---|---|---|
| 7,226,874 B2 | 6/2007 | Matsuyama et al. |
| 2002/0020497 A1 | 2/2002 | Ohmi et al. |
| 2002/0025591 A1* | 2/2002 | Ohnuma et al. ............... 438/30 |
| 2002/0031876 A1 | 3/2002 | Hara et al. |
| 2002/0102783 A1 | 8/2002 | Fujimoto et al. |
| 2002/0146872 A1 | 10/2002 | Arai et al. |
| 2003/0094611 A1 | 5/2003 | Hayakawa |
| 2004/0007748 A1 | 1/2004 | Sakama et al. |
| 2004/0050494 A1 | 3/2004 | Ohmi et al. |
| 2004/0217431 A1 | 11/2004 | Shimada |
| 2005/0115930 A1* | 6/2005 | Tanaka et al. ............ 219/121.6 |
| 2005/0139786 A1 | 6/2005 | Tanaka et al. |
| 2005/0263835 A1 | 12/2005 | Sakama et al. |
| 2006/0014335 A1 | 1/2006 | Ohnuma et al. |

FOREIGN PATENT DOCUMENTS

| | | |
|---|---|---|
| EP | 1 617 483 | 1/2006 |
| EP | 1 622 194 | 2/2006 |
| JP | 2001-135824 | 5/2001 |
| JP | 2002-151523 | 5/2002 |
| JP | 2002-203862 | 7/2002 |
| JP | 2004-319952 | 11/2004 |
| WO | WO 2004/017396 | 2/2004 |
| WO | WO 2005/004223 | 1/2005 |

* cited by examiner

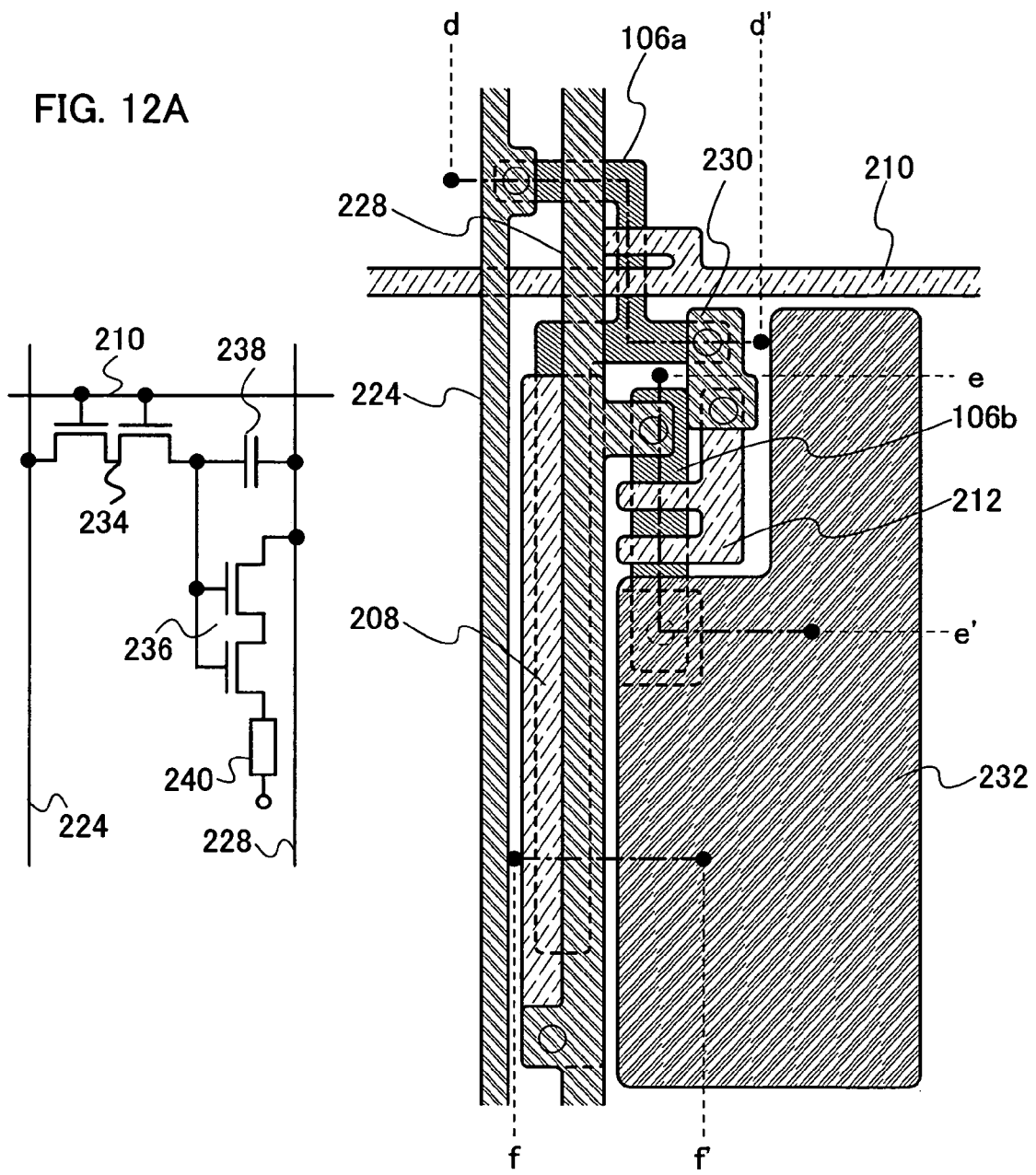

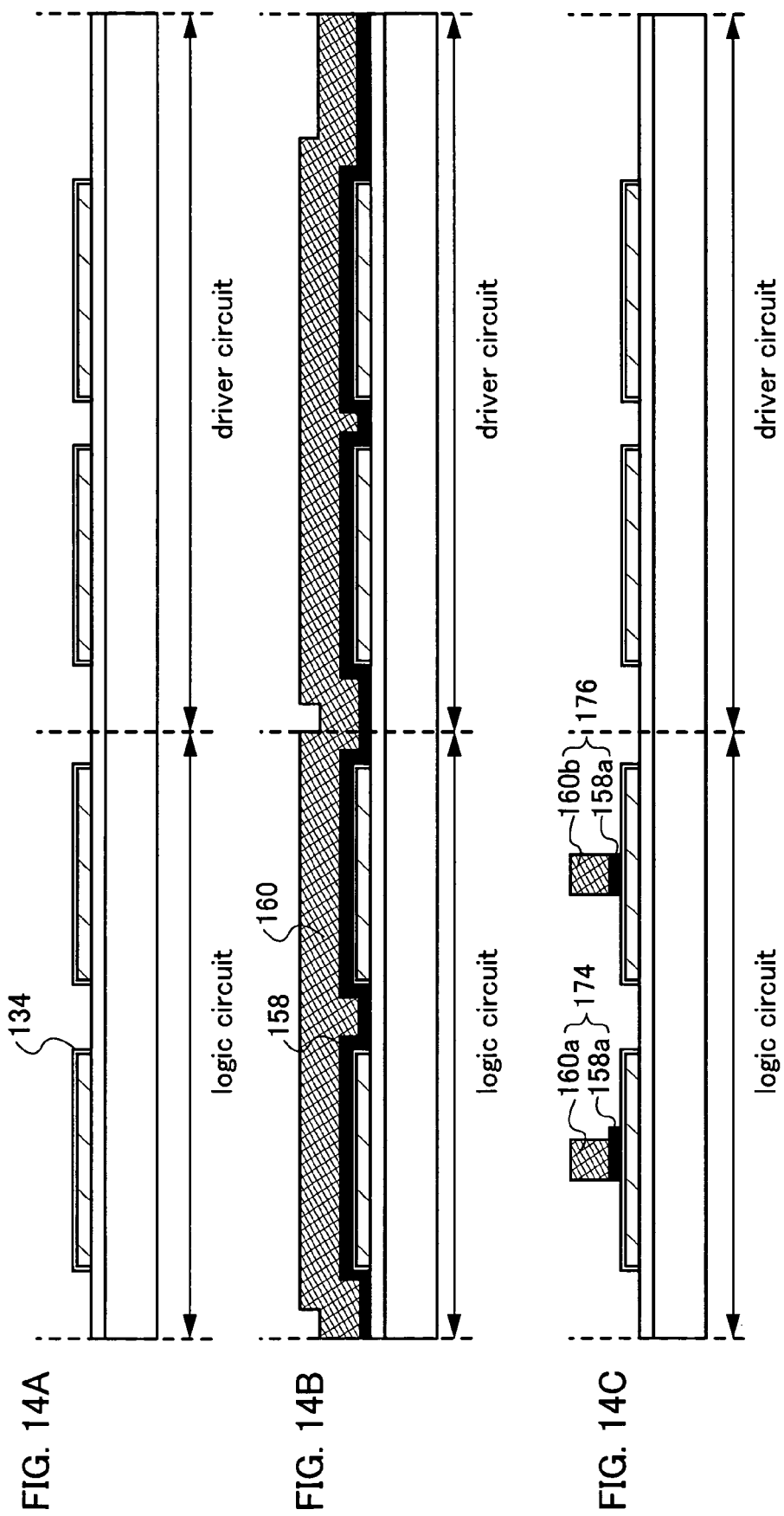

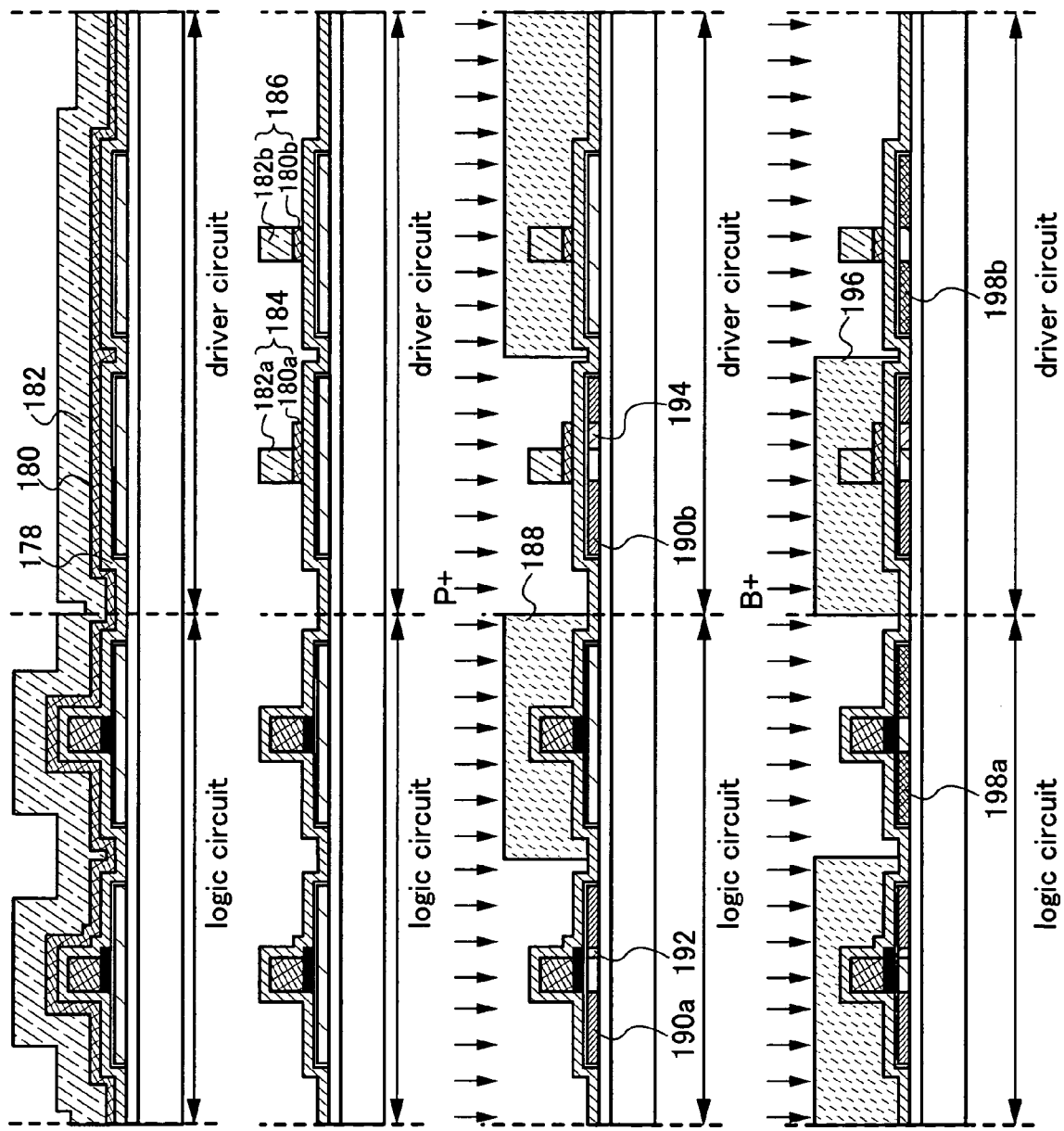

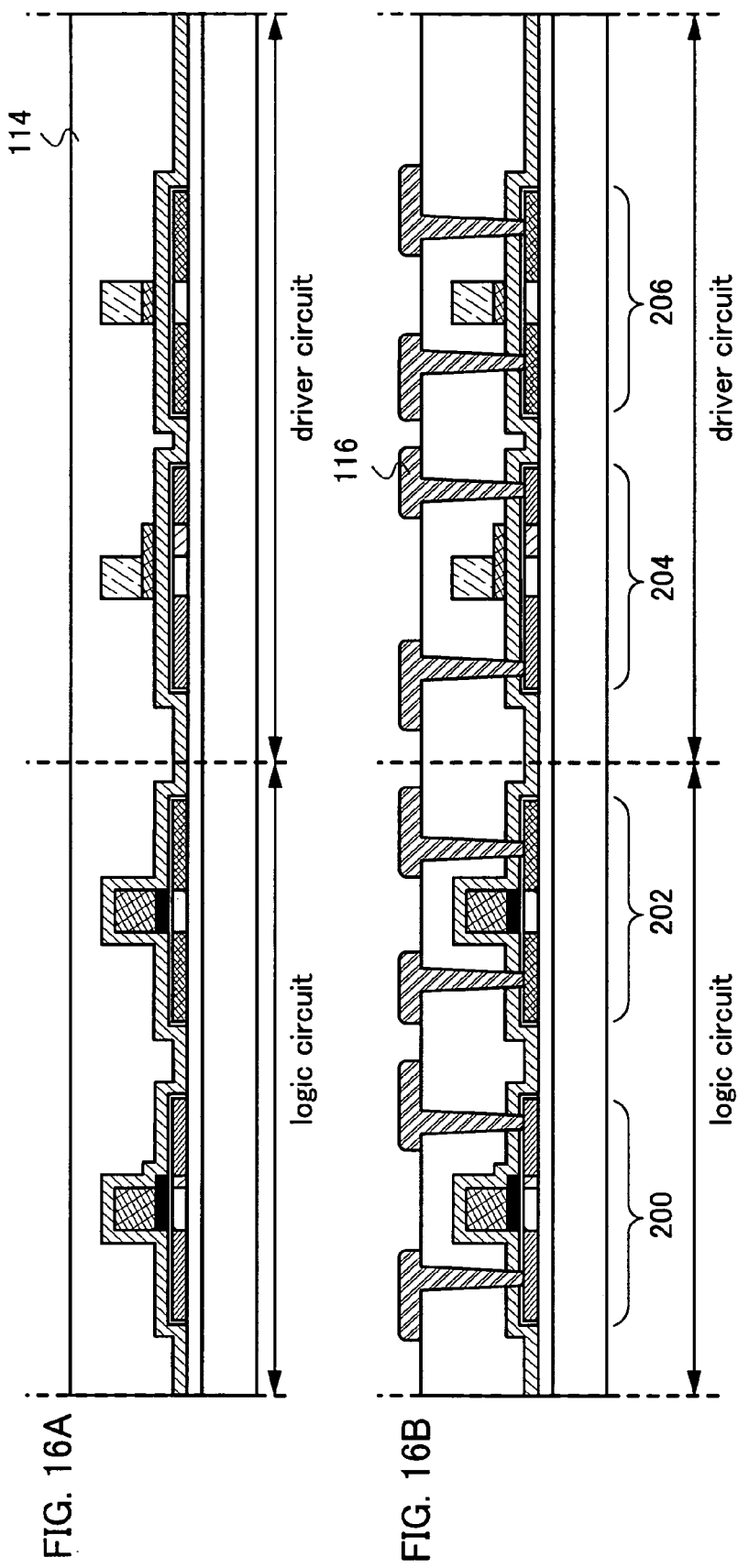

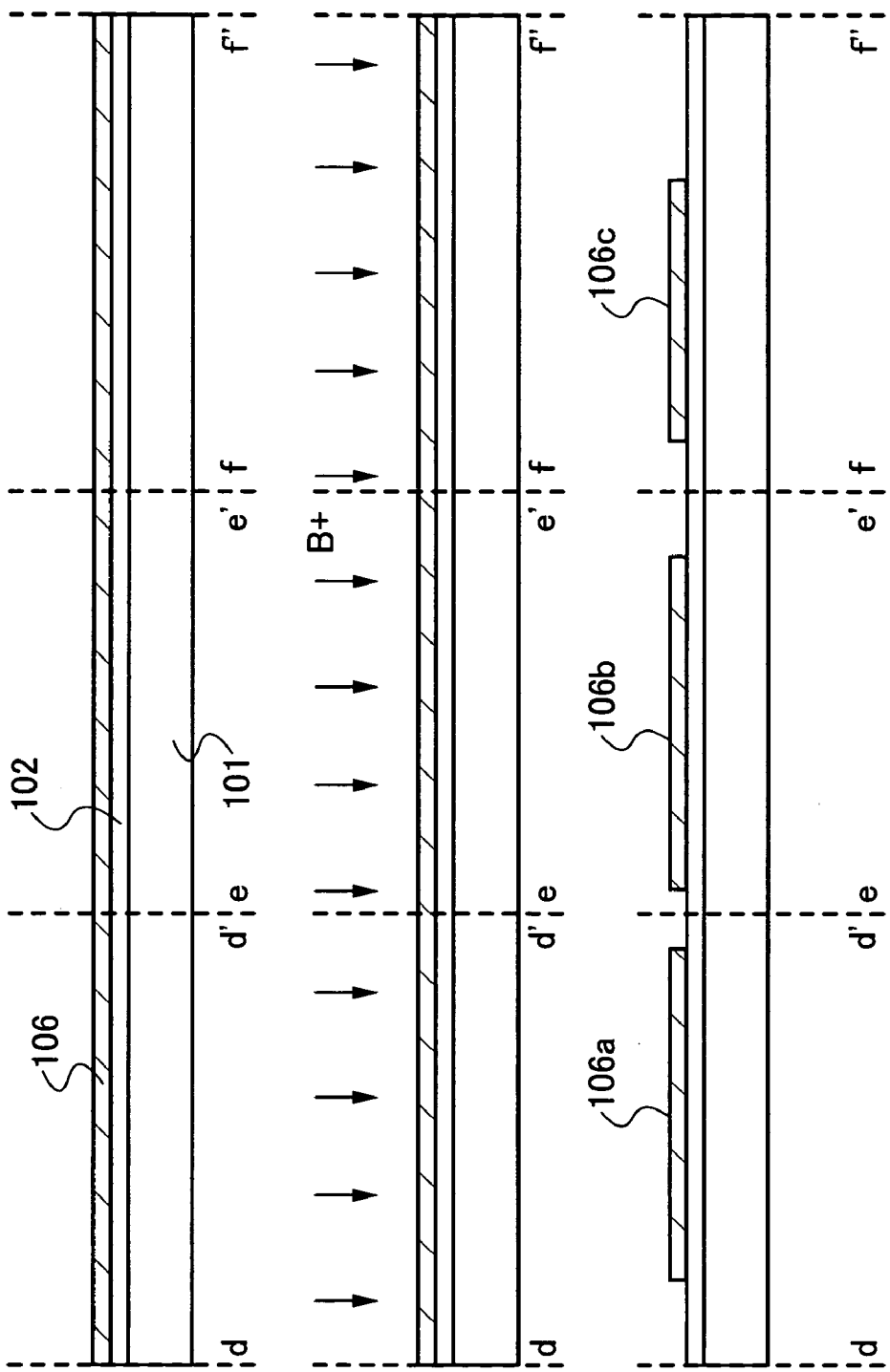

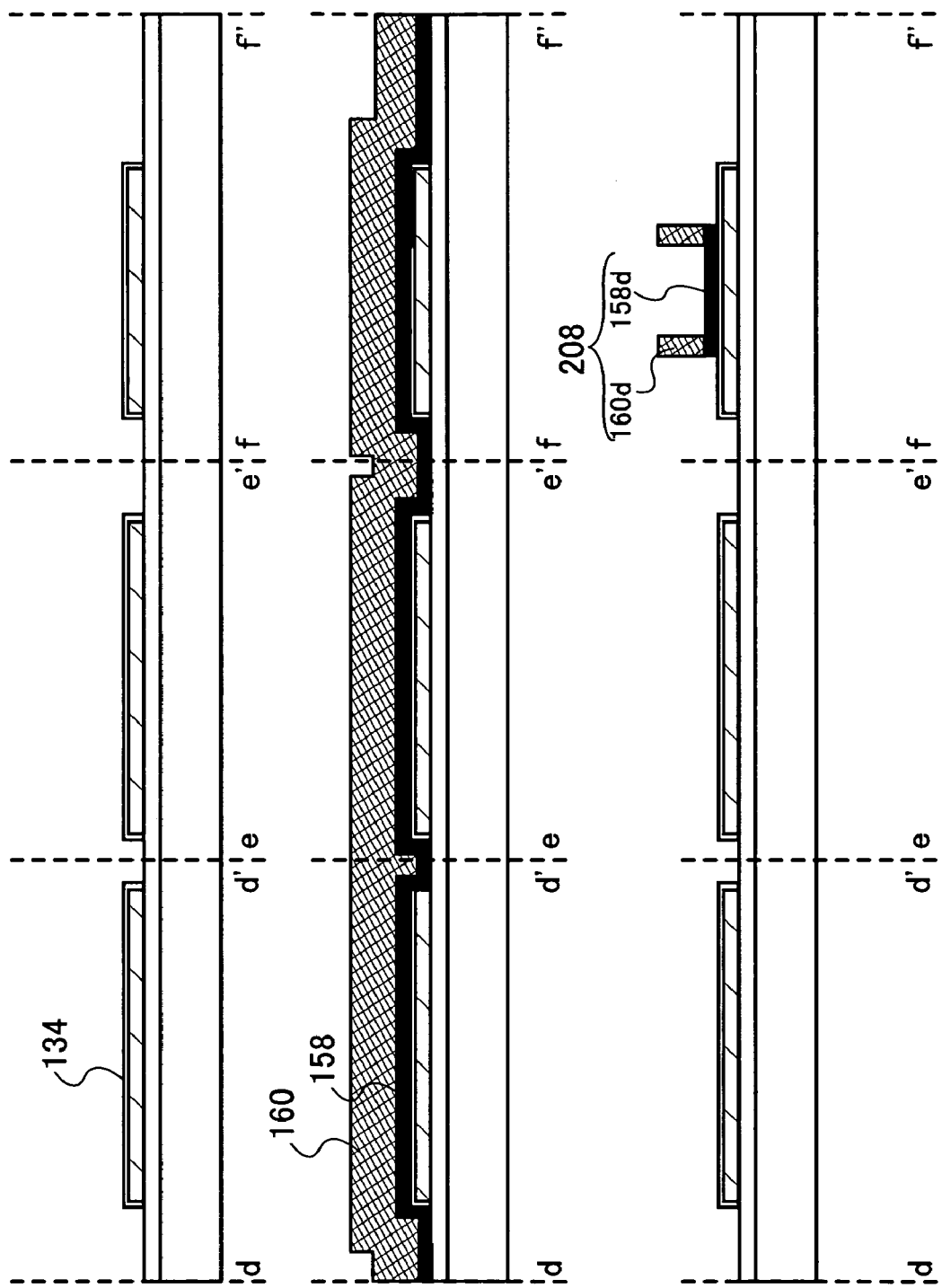

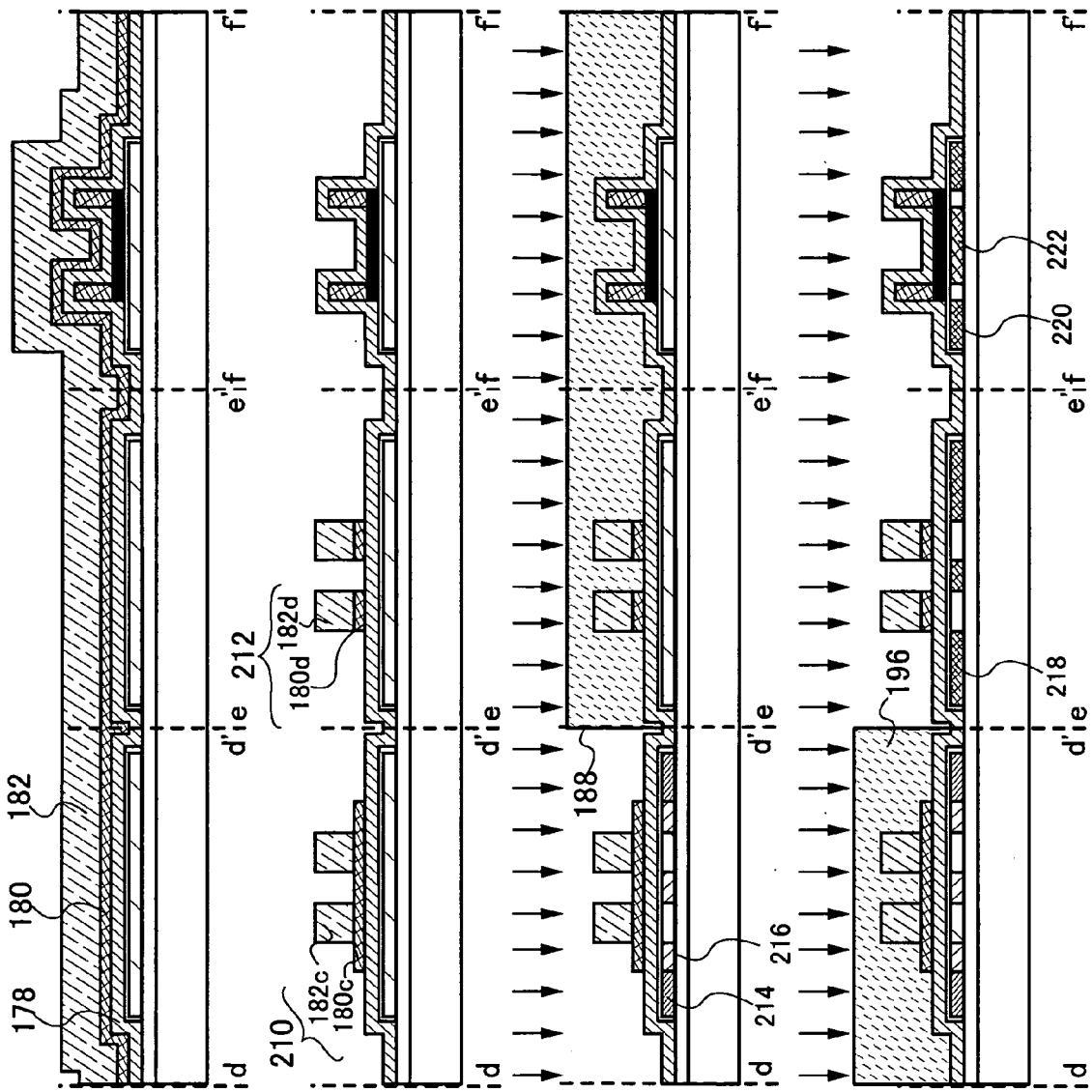

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, which includes a step of performing plasma treatment to an insulating film or a semiconductor layer.

2. Description of the Related Art

In recent years, techniques of forming a field-effect transistor (which includes a MOS transistor, a thin film transistor, an insulated-gate transistor, or the like; hereinafter also simply referred to as a "transistor") by using a semiconductor thin film (with a thickness of about several nanometers to several hundred nanometers) formed over a substrate having an insulating surface such as glass, have been attracting attention. Transistors are widely applied to integrated circuits, liquid crystal display devices, and the like. Further, development of transistors with finer structures is demanded in accordance with the need for higher performance of electronic devices.

It is order to achieve downsizing of transistors, it is required to form an insulating layer such as a gate insulating layer with a thin shape, as well as conductive layers such as a gate electrode and source and drain wires. A gate insulating layer of a transistor or the like is generally manufactured by depositing a thin film by plasma CVD, sputtering, or the like (see Patent Document 1, for example).

As an application field of a transistor, a display technology called an active matrix display has been known. In such an active matrix display device, a transistor is provided in each pixel arranged in matrix, and the switching operation of the transistor is utilized for driving a display medium such a liquid crystal or an electroluminescence element. In an active matrix display, development for expanding an effective pixel region in each pixel (as for a transmissive liquid crystal display device, it means a ratio of a light-transmissive area to one pixel, while as for a display device using an electroluminescence element, it means a ratio of a light-emissive area to one pixel) has been advanced. In order to increase the area of an effective pixel region, it is required to minimize the area occupied by a transistor disposed in each pixel as much as possible. In addition, development of forming a driver circuit and a pixel portion over a common substrate has also been advanced in order to reduce the manufacturing cost. Among them, a transistor using a polycrystalline silicon film is known for its high-speed operation since it has a higher electron field-effect mobility than a transistor using a hydrogenated amorphous silicon film.

In the case of forming a driver circuit and a pixel portion over a common substrate by using thin film transistors, an area occupied by a region other than a pixel region (called a frame region) tends to be larger as compared to the case of mounting the driver circuit by a surface mounting technique such as COG (Chip On Glass), or TAB (Tape Automated Bonding) by which a driver IC is mounted on a wiring board in a film form. In order to reduce the area of the frame region, it is also required to reduce a circuit scale of the driver circuit. As for the pixel configuration also, various attempts have been made, for example by combining a switching transistor with a memory element such as a static RAM (SRAM) in one pixel.

In the foregoing background, such a technique has been known that a photomask or a leticle including an auxiliary pattern which is formed of a diffraction grating pattern or a semi-transmissive film having a function of reducing the light intensity is applied to a photolithography process for forming a gate electrode (see Patent Document 2, for example). In addition, such a technique has also been known that a gate electrode is formed to have a two-layer structure with different conductive materials with the condition that the first layer is wider than the second layer, so that doping is performed to a semiconductor layer through a part of the first layer (see Patent Document 3, for example).

[Patent Document 1] Japanese Patent Laid-Open No. 2001-135824

[Patent Document 2] Japanese Patent Laid-Open No. 2002-151523

[Patent Document 3] Japanese Patent Laid-Open No. 2002-203862

However, an insulating film formed by CVD or sputtering to have a thickness of several nanometers has defects inside the film. For example, in the case of using an insulating film formed by plasma CVD as a gate insulating film, there is a possibility of causing a leakage current or a short between a semiconductor layer and a gate electrode. Further, while a dense insulating film can be formed by oxidizing the surface of a semiconductor film, a cost-effective glass substrate or the like having low heat resistance is practically used for manufacturing transistors; therefore, thermal oxidation is difficult to be performed.

SUMMARY OF THE INVENTION

In view of the foregoing problems, it is an object of the invention to provide a semiconductor device and a manufacturing method thereof, by which a dense and high-quality film with few defects can be formed as a conductive layer, an insulating layer, semiconductor layer, or the like, as compared to the case of forming a film by chemical vapor deposition, sputtering, or the like.

It is another object of the invention to provide a semiconductor device having a circuit with high performance and high reliability. It is still another object of the invention to improve the reliability of the semiconductor device in order to improve the reliability of an electronic device having the semiconductor device.

It is yet another object of the invention to provide a semiconductor device in which a plurality of elements are formed in a limited area, minimizing an area occupied by the elements, so that higher resolution (increase in the number of pixels) can be achieved as well as downsizing of each pixel pitch and high integration of a driver circuit for driving a pixel portion can be advanced in accordance with downsizing of the device. It is yet another object of the invention to improve the image quality of semiconductor device or to downsize the device by integrating various circuits in order to improve the quality of an electronic device having the semiconductor device.

A manufacturing method of a semiconductor device of the invention includes a step of crystallizing a semiconductor layer by irradiation with continuous wave laser beams or pulsed laser beams with a repetition rate of 10 MHz or more, while scanning in one direction; a step of photolithography with the use of a photomask or a leticle including an auxiliary pattern which is formed of a diffraction grating pattern or a semi-transmissive film having a function of reducing the light intensity; and a step of performing oxidation, nitridation, or surface-modification to the surface of the semiconductor film, an insulating film, or a conductive film, by using plasma with a low electron temperature and a high electron density.

That is, in the invention, in the case of downsizing a field effect transistor (an n-type transistor is assumed here) within such a level that does not cause a short channel effect with the condition that a gate insulating layer is formed with a thickness of 10 to 120 nm, or preferably 10 to 90 nm, and a channel is formed with a length of 0.2 to 8 µm, or preferably 0.52 to 3 µm, and providing a low concentration impurity (LDD) region so as to overlap with a gate electrode, the overlapped ratio can be freely designed in accordance with the driving voltage. As for a shift register and/or a logic circuit which is operated with a driving voltage of 1.5 to 6 V, or preferably 3 to 5 V, the aforementioned steps are performed so that a low concentration impurity region is provided so as to overlap with a gate electrode by a length of 0.2 to 1 µm. As for a transistor which operates with a voltage higher than the above but not higher than 20 V, and typically in the range of 8 to 18 V, the aforementioned steps are performed so that a low concentration impurity region is provided so as to overlap with a gate electrode by a length of 1 to 5 µm.

One feature of the invention is to provide a semiconductor device including: a semiconductor layer formed by crystallization with continuous wave laser or pulsed laser with a repetition rate of 10 MHz to 100 GHz; an insulating film formed on the semiconductor layer by oxidation or nitridation treatment with the use of oxygen radicals and/or nitrogen radicals produced by plasma with an electron temperature of 3 eV or less and an electron density of $1\times10^{11}$ cm$^{-3}$ or more; and a conductive layer formed over the semiconductor layer by using a first mask pattern and a second mask pattern. The first mask pattern is intentionally formed to have a nonuniform thickness by using a photomask or a leticle including an auxiliary pattern which is formed of a diffraction grating pattern or a semi-transmissive film having a function of reducing the light intensity, while the second mask pattern is not intentionally formed to have a nonuniform thickness.

One feature of the invention is to provide a semiconductor device including: a semiconductor layer formed by crystallization with continuous wave laser or pulsed laser with a repetition rate of 10 MHz to 100 GHz; a first insulating film formed on the semiconductor layer by oxidation or nitridation treatment with the use of oxygen radicals and/or nitrogen radicals produced by plasma with an electron temperature of 3 eV or less and an electron density of $1\times10^{11}$ cm$^{-3}$ or more; a second insulating film formed over the first insulating film; and a conductive layer formed over the semiconductor layer by using a first mask pattern and a second mask pattern. The first mask pattern is intentionally formed to have a nonuniform thickness by using a photomask or a leticle including an auxiliary pattern which is formed of a diffraction grating pattern or a semi-transmissive film having a function of reducing the light intensity, while the second mask pattern is not intentionally formed to have a nonuniform thickness.

One feature of the invention is to provide a semiconductor device including: a semiconductor layer formed by crystallization with continuous wave laser or pulsed laser with a repetition rate of 10 MHz to 100 GHz; an insulating film formed on the semiconductor layer by oxidation or nitridation treatment with the use of oxygen radicals and/or nitrogen radicals produced by plasma with an electron temperature of 3 eV or less and an electron density of $1\times10^{11}$ cm$^{-3}$ or more; and a conductive layer formed over the semiconductor layer by using a first mask pattern and a second mask pattern. The first mask pattern is intentionally formed to have a nonuniform thickness by using a photomask or a leticle including an auxiliary pattern which is formed of a diffraction grating pattern or a semi-transmissive film having a function of reducing the light intensity, while the second mask pattern is not intentionally formed to have a nonuniform thickness.

One feature of the invention is to provide a manufacturing method of a semiconductor device, including: a first step of crystallizing a semiconductor layer with continuous wave laser or pulsed laser with a repetition rate of 10 MHz to 100 GHz; a second step of forming an insulating layer on the semiconductor layer which is crystallized in the first step, by oxidation or nitridation treatment with the use of oxygen radicals and/or nitrogen radicals produced by plasma with an electron temperature of 3 eV or less and an electron density of $1\times10^{11}$ cm$^{-3}$ or more; and a third step of forming a conductive layer over the semiconductor layer, and etching the conductive layer by using a first mask pattern and a second mask pattern. The first mask pattern is intentionally formed to have a nonuniform thickness by using a photomask or a leticle including an auxiliary pattern which is formed of a diffraction grating pattern or a semi-transmissive film having a function of reducing the light intensity, while the second mask pattern is not intentionally formed to have a nonuniform thickness.

One feature of the invention is to provide a manufacturing method of a semiconductor device, including: a first step of crystallizing a semiconductor layer with continuous wave laser or pulsed laser with a repetition rate of 10 MHz to 100 GHz; a second step of forming a first insulating layer on the semiconductor layer which is crystallized in the first step, by oxidation or nitridation treatment with the use of oxygen radicals and/or nitrogen radicals produced by plasma with an electron temperature of 3 eV or less and an electron density of $1\times10^{11}$ cm$^{-3}$ or more; a third step of depositing a second insulating layer over the first insulating layer; and a fourth step of forming a conductive layer over the semiconductor layer, and etching the conductive layer by using a first mask pattern and a second mask pattern. The first mask pattern is intentionally formed to have a nonuniform thickness by using a photomask or a leticle including an auxiliary pattern which is formed of a diffraction grating pattern or a semi-transmissive film having a function of reducing the light intensity, while the second mask pattern is not intentionally formed to have a nonuniform thickness.

One feature of the invention is to provide a manufacturing method of a semiconductor device, including: a first step of crystallizing a semiconductor layer with continuous wave laser or pulsed laser with a repetition rate of 10 MHz to 100 GHz; a second step of depositing an insulating layer on the semiconductor layer which is crystallized in the first step; a third step of oxidizing or nitriding the insulating layer with the use of oxygen radicals and/or nitrogen radicals produced by plasma with an electron temperature of 3 eV or less and an electron density of $1\times10^{11}$ cm$^{-3}$ or more; and a fourth step of forming a conductive layer over the semiconductor layer, and etching the conductive layer by using a first mask pattern and a second mask pattern. The first mask pattern is intentionally formed to have a nonuniform thickness by using a photomask or a leticle including an auxiliary pattern which is formed of a diffraction grating pattern or a semi-transmissive film having a function of reducing the light intensity, while the second mask pattern is not intentionally formed to have a nonuniform thickness.

Note that in this specification, a semiconductor device means a liquid crystal display device, an electro-optic device, a display device utilizing electroluminescence elements, light-emitting device, a semiconductor integrated circuit, an electronic device, an electronic appliance, and all other devices which can function by at least partially utilizing semiconductor characteristics.

According to the invention, a dense and high-quality film with few defects such as pin holes can be formed by modifying the surface of an insulating film functioning as a base film by oxidation or nitridation with plasma treatment, as compared to an insulating film formed by CVD or sputtering; therefore, characteristics of semiconductor elements such as transistors can be improved and stabilized.

According to the invention, structures of a gate electrode and a low concentration impurity region of a transistor can be manufactured with flexible designs in consideration of the driving conditions of the transistor, by using a photomask or a leticle including an auxiliary pattern which is formed of a diffraction grating pattern or a semi-transmissive film having a function of reducing the light intensity. That is, transistors having different driving conditions such as the driving voltage or polarity (conductivity) can be formed over a common substrate in accordance with the operating characteristics. In addition, since a gate electrode and a wire which is formed in the same layer as the gate electrode can be formed to have different cross-sectional shapes, density of wires can be increased.

According to the invention, elements suitable for each circuit can be manufactured by a method of forming pixels, a driver circuit for driving the pixels, and a logic circuit over a common insulating surface. Thus, a device with high performance and high reliability can be obtained.

BRIEF DESCRIPTION OF THE DRAWINGS

In the accompanying drawings,

FIGS. 12A and 12B illustrate a manufacturing process of a semiconductor device in accordance with Embodiment Mode 8;

FIGS. 14A to 14C illustrate a manufacturing process of a semiconductor device in accordance with Embodiment Mode 8;

FIGS. 15A to 15D illustrate a manufacturing process of a semiconductor device in accordance with Embodiment Mode 8.

FIGS. 16A and 16B illustrate a manufacturing process of a semiconductor device in accordance with Embodiment Mode 8;

FIGS. 17A to 17C illustrate a manufacturing process of a semiconductor device in accordance with Embodiment Mode 8;

FIGS. 18A to 18C illustrate a manufacturing process of a semiconductor device in accordance with Embodiment Mode 8;

FIGS. 19A to 19D illustrate a manufacturing process of a semiconductor device in accordance with Embodiment Mode 8;

DETAILED DESCRIPTION OF THE INVENTION

EMBODIMENT MODE 1

Figure 1:
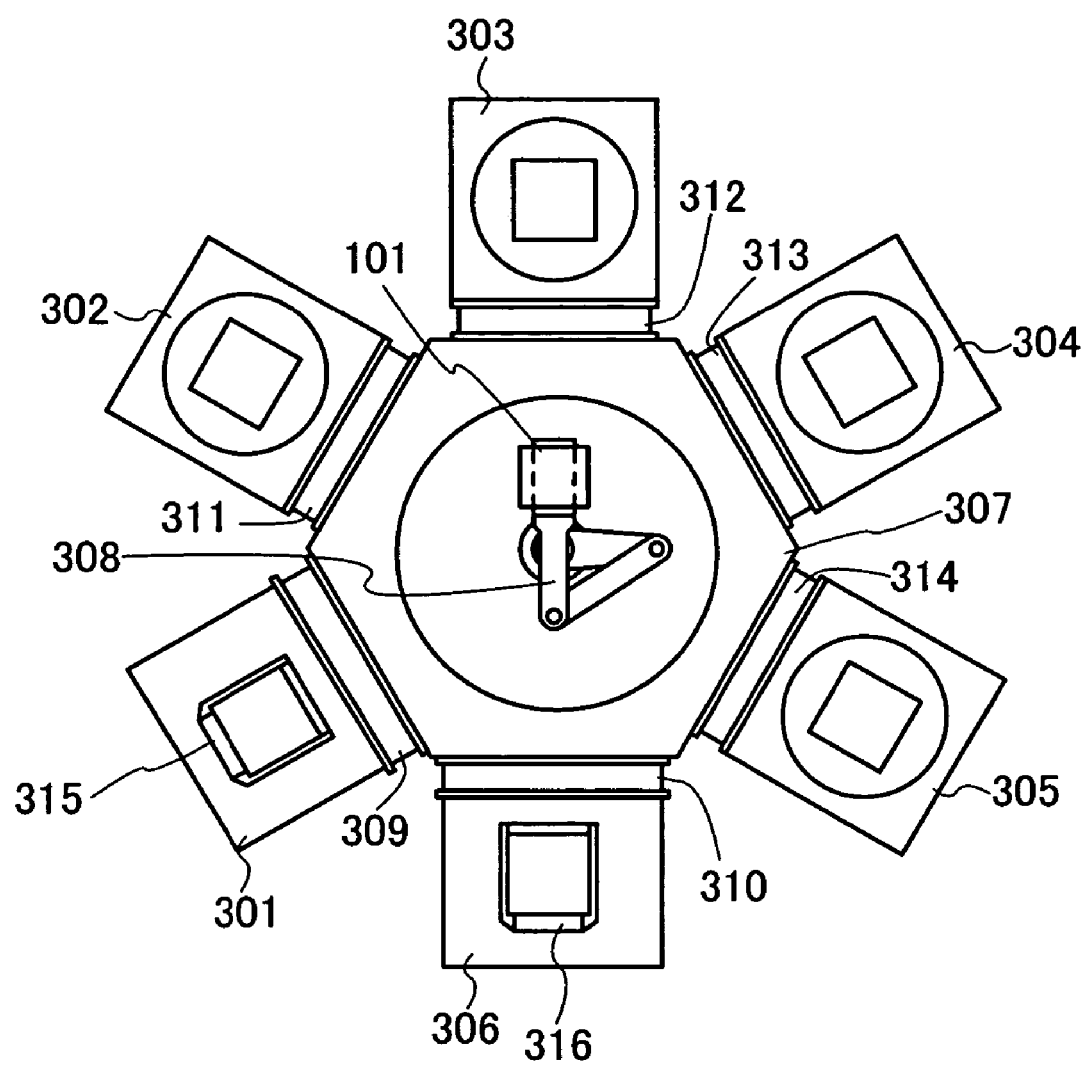
FIG. 1 illustrates an exemplary plasma treatment device in accordance with the manufacture of a semiconductor device.

FIG. 1 illustrates an exemplary plasma treatment apparatus in accordance with the manufacture of a semiconductor device. The plasma treatment apparatus shown in FIG. 1 has a plurality of treatment chambers capable of generating plasma, a common chamber for transferring substrates to each chamber, and a load lock chamber for taking in or out the substrates. Thus, in the case of continuously performing deposition of an insulating film, a conductive layer, or a semiconductor layer and plasma treatment thereof, a plasma treatment apparatus having a plurality of treatment chambers can be used. Note that FIG. 1 is a top plan view showing one exemplary structure of a plasma treatment apparatus shown in this embodiment mode.

The plasma treatment chamber shown as an illustrative example in FIG. 1 includes a first treatment chamber 302, a second treatment chamber 303, a third treatment chamber 304, a fourth treatment chamber 305, load lock chambers 301 and 306, and a common chamber 307. Each treatment chamber has airtightness. Each treatment chamber is provided with a vacuum evacuator, a gas inlet, and a plasma generator.

The load lock chambers 301 and 306 are the chambers for transferring a sample (substrate to be treated) into each chamber. The common chamber 307 is provided in common for each of the load lock chambers 301 and 306, the first treatment chamber 302, the second treatment chamber 303, the third treatment chamber 304, and the fourth treatment chamber 305. A substrate 101 is transferred to each treatment chamber from the load lock chambers 301 and 306 via the common chamber 307. The first treatment chamber 302, the second treatment chamber 303, the third treatment chamber 304, and the fourth treatment chamber 305 are the chambers for depositing a conductive layer, an insulating layer, or a semiconductor layer onto the substrate 101, or performing etching treatment, plasma treatment or the like thereto. Gate valves 309, 310, 311, 312, 313, and 314 are respectively provided between the common chamber 307 and the load lock chambers 301 and 306, and between the common chamber 307 and the first treatment chamber 302, the second treatment chamber 303, the third treatment chamber 304, and the fourth treatment chamber 305. Note that the common chamber 307 is provided with a robot arm 308, with which the substrate 101 is transferred to each chamber.

Figure 2:
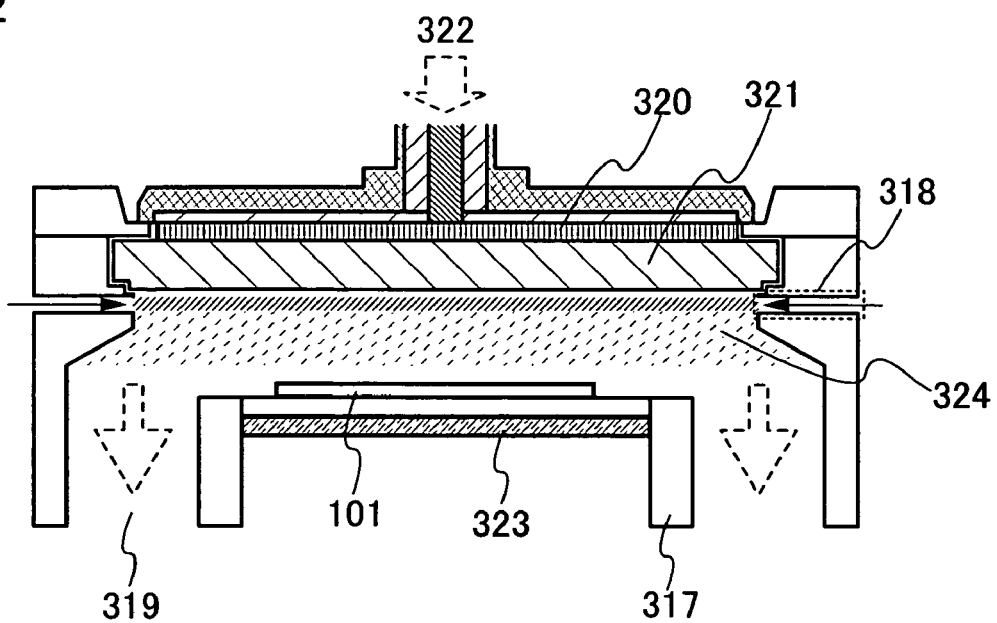
FIG. 2 illustrates an internal structure of a treatment chamber for performing high-density plasma treatment.

The first treatment chamber 302, the second treatment chamber 303, the third treatment chamber 304, and the fourth treatment chamber 305 have different internal structures in accordance with the intended use. As the kind of treatment, there is plasma treatment, film deposition treatment, thermal treatment, etching treatment, or the like. FIG. 2 shows an exemplary internal structure of a treatment chamber for performing plasma treatment. The inside of the treatment chamber is provided with a supporting base 317 for positioning the substrate 101 to be subjected to plasma treatment, a gas supply inlet 318 for supplying gas, an exhaust outlet 319, an antenna 320, a dielectric plate 321, and an RF power supply portion 322 for supplying high-frequency waves for generating plasma. In addition, the temperature of the substrate 101 can be controlled by providing a temperature controller 323 under the supporting base 317. An example of the plasma treatment is described below.

Herein, plasma treatment includes oxidation treatment, nitridation treatment, oxynitridation treatment, hydrogenation treatment, and surface-modifying treatment of a semiconductor layer, an insulating film, or a conductive layer. Such treatment may be performed by selecting an appropriate gas in accordance with the intended use.

For example, the oxidation treatment or nitridation treatment may be performed in the following manner. First, the treatment chamber is evacuated, and gas containing oxygen or a nitrogen is supplied from the gas supply inlet 318. As the gas containing oxygen, for example, a mixed gas of oxygen ($O_2$) and a rare gas or a mixed gas of oxygen, hydrogen, and a rare gas can be supplied. In addition, as the gas containing nitrogen, for example, a mixed gas of nitrogen and a rare gas or a mixed gas of an ammonia gas and a rare gas can be supplied. Next, the substrate 101 is set on the supporting base 317 having the temperature controller 323, so that the substrate 101 is heated at a temperature ranging from 100 to 550° C. Note that the substrate 101 and the dielectric plate 321 are set to have a distance in the range of 20 to 80 mm (preferably, 20 to 60 mm) therebetween.

Next, microwaves are supplied to the antenna 320 from the RF power supply portion 322. Here, microwaves with a frequency of 2.45 GHz is supplied. By supplying microwaves to the treatment chamber through the dielectric plate 321, high-frequency plasma 324 which is activated by plasma excitation is generated. When plasma is excited with microwaves supplied, plasma with a low electron temperature (3 eV or less, or preferably 1.5 eV or less) and a high electron density ($1 \times 10^{11}$ $cm^{-3}$ or more) can be generated. With oxygen radicals (which may include OH radicals in some cases) or nitrogen radicals (which may include NH radicals in some cases) generated by such high-density plasma, the surface of the semiconductor layer can be oxidized or nitrided.

For example, in the case of performing plasma treatment in an atmosphere of an $NH_3$ gas and an Ar gas, high-density excited plasma in which an $NH_3$ gas is mixed with an Ar gas is generated with microwaves. In the high-density excited plasma in which an $NH_3$ gas is mixed with an Ar gas, radicals (Ar*) are produced by excitation of the Ar gas with microwaves supplied, thereby the Ar radicals collide with $NH_3$ molecules. Thus, nitrogen radicals (which may include NH radicals in some cases) are produced. Such radicals react with the substrate 101, thereby the substrate 101 can be nitrided. After that, the $NH_3$ gas and the Ar gas are exhausted to the outside of the treatment chamber through the exhaust outlet 319. Meanwhile, in the case of supplying oxygen, nitrous oxide, or the like, oxygen radicals (which may include OH radicals in some cases) are produced, thereby the substrate 101 or a thin film over the substrate 101 can be oxidized.

Figure 3:
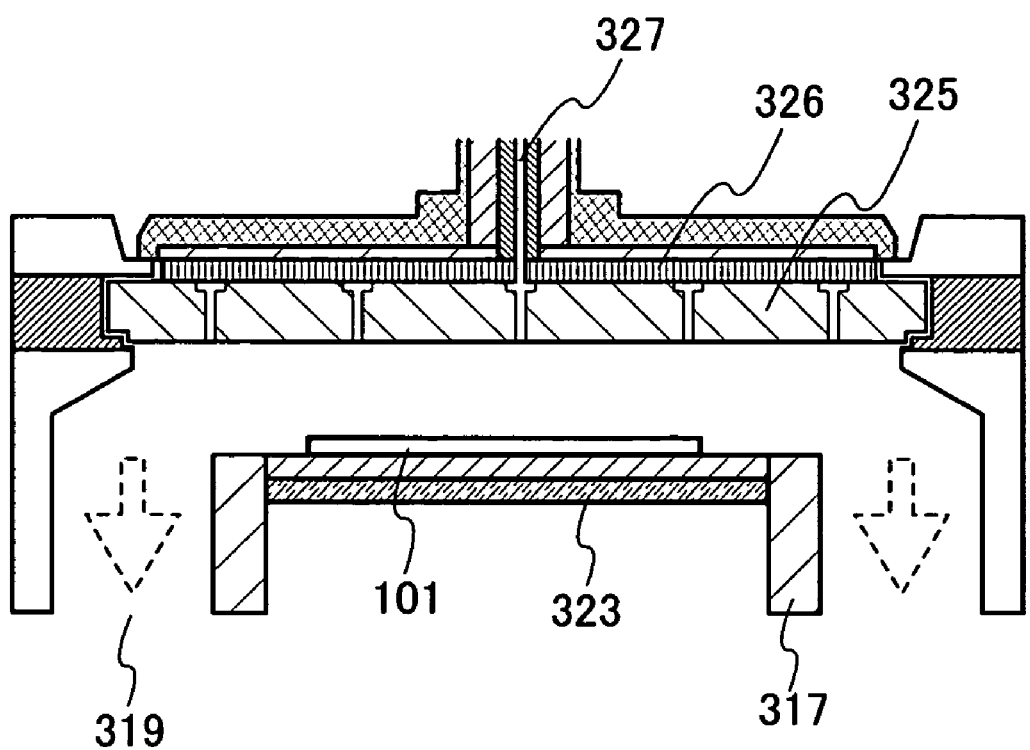
FIG. 3 illustrates an internal structure of a treatment chamber for depositing a film by plasma CVD.

FIG. 3 shows an exemplary internal structure of a treatment chamber for depositing a thin film with plasma. The inside of the chamber is provided with a supporting base 317, an electrode plate 325 having slits for gas to flow through, an RF power supply portion 326, a gas inlet 327, and an exhaust outlet 319. In addition, the temperature of the substrate 101 can be controlled by providing a temperature controller 323 under the supporting base 317.

In order to deposit a semiconductor layer in the treatment chamber shown in FIG. 3, a thin film can be formed over the substrate 101 by exciting plasma by supplying a semiconductor material gas such as silane ($SiH_4$), disilane ($Si_2H_6$), or germane ($GeH_4$), and a balance gas as required, such as hydrogen, helium, argon, or xenon. In order to deposit an insulating film, silane or disilane may be mixed with a gas containing nitrogen, oxygen, nitrous oxide, ammonia, or the like. Alternatively, organic silane may be used as typified by TEOS (TEtraethyl Ortho Silicate, $(C_2H_5O)_4Si$). As a frequency for exciting plasma, frequencies of HF or VHF waves ranging from 10 to 120 MHz, or microwaves typified by 2.45 GHz can be used. In the case of using a frequency of microwaves, a treatment chamber with a similar structure to that in FIG. 2 can be used, while changing the kind of gas to be supplied.

By performing high-density plasma treatment to the surface of a polycrystalline silicon film or a single crystalline silicon, an insulating film with a thickness of 1 to 20 nm, or typically 5 to 10 nm can be formed on the semiconductor. Since the reaction which occurs in this case is a solid-phase reaction, an interface state density between the insulating film and the semiconductor layer can be controlled extremely low. With such high-density plasma treatment, the semiconductor layer (polycrystalline silicon (crystalline silicon) or single crystalline silicon) is directly oxidized (or nitrided); therefore, variations in thickness of the insulating film formed thereon can be suppressed quite low. In addition, since it can be prevented that the oxidation progresses more than necessary at a crystal grain boundary of polycrystalline silicon, an excellent state can be obtained. That is, by solid-phase oxidizing the surface of the semiconductor layer by the high-density plasma treatment shown herein, it can be prevented that an abnormal oxidation reaction occurs at the crystal grain boundary, and thus a uniform insulating film with a low interface state density can be formed.

In a field effect transistor, a gate insulating layer can be formed by directly oxidizing, nitriding, or oxynitriding a semiconductor layer by a solid-phase reaction with such high-density plasma treatment. Alternatively, a gate insulating layer can be obtained by depositing an insulating film formed of silicon oxide, silicon oxynitride, silicon nitride, or the like by CVD utilizing plasma or thermal reaction, onto the insulating film which is formed on the semiconductor layer by a solid-phase reaction with high-density plasma. In any case, a field effect transistor having a gate insulating layer, a part or all of which is formed with an insulating film formed by high-density plasma treatment, can be reduced in variations of characteristics.

In addition, a crystalline semiconductor layer, which is obtained by crystallizing a semiconductor layer by irradiation with continuous wave (CW) laser beams or pulsed laser beams with a repetition rate of 10 MHz or more, while scanning in one direction, has a characteristic that crystals grow in the scan direction of the beams. By positioning a channel direction of a transistor (a direction in which carriers flow when a channel is formed) along with the scan direction, and combining it with the aforementioned gate insulating layer, such a transistor can be obtained that has small variations in characteristics and has high electron field-effect mobility.

As an illustrative example, description is made below of an example of depositing a base insulating layer on the substrate in the first treatment chamber 302, performing plasma treatment thereto in the second treatment chamber 303, and depositing a semiconductor layer thereon in the third treatment chamber 304.

First, the substrate 101 is carried into the load lock chamber 301 with a whole cassette 315 which stores a number of substrates. After the cassette 315 is carried in, a loading port of the load lock chamber 301 is closed. With this condition, the gate valve 309 is opened to take out one substrate from the cassette 315, which is then set in the common chamber 307 with the robot arm 308. In this case, positioning of the substrate 101 is carried out in the common chamber 307.

Next, the gate valve 309 is closed, and the gate valve 311 is opened. Then, the substrate 101 is transferred to the first treatment chamber 302. In the first treatment chamber 302, film deposition treatment is performed at a temperature of 150 to 300° C. to form a base insulating film. The base insulating layer can be formed to gave a single-layer structure or a stacked-layer structure of an insulating layer containing oxygen and/or nitrogen, such as silicon oxide ($SiO_x$), silicon nitride ($SiN_x$), silicon oxynitride ($SiO_xN_y$) (x>y), and silicon nitride oxide ($SiN_xO_y$) (x>y). Here, a silicon nitride oxide film is formed as a first insulating layer, and a silicon oxynitride film is formed as a second insulating layer, by plasma CVD in the first treatment chamber 302. Note that the film deposition method is not limited to the plasma CVD, and sputtering using a target may be used as well.

After depositing the base insulating layer, the substrate 101 is taken out to the common chamber 307 with the robot arm 308, and then transferred to the second treatment chamber 303. In the second treatment chamber 303, plasma treatment is performed to the base insulating layer to be oxidized or nitrided. Here, plasma treatment is performed under an oxygen atmosphere (e.g., under an atmosphere containing oxygen and a rare gas, an atmosphere containing oxygen, hydrogen, and a rare gas, or an atmosphere containing nitrous oxide and a rare gas) in the second treatment chamber 303, thereby oxidizing the surface of the base insulating layer.

After oxidizing or nitriding the surface of the base insulating layer, the substrate is taken out to the common chamber 307 with the robot arm 308, and then transferred to the third treatment chamber 304. In the third treatment chamber 304, film deposition treatment is performed at a temperature of 150 to 300° C., thereby forming a semiconductor layer by plasma CVD. Note that the semiconductor layer may be a microcrystalline semiconductor layer, an amorphous silikon film, an amorphous germanium film, an amorphous silicon germanium film, stacked layers of such films, or other. In addition, thermal treatment, by which hydrogen concentration of the semiconductor layer is reduced by setting the temperature at 350 to 500° C., may be omitted. Note that although the example herein show the case of using plasma CVD, sputtering using a target may be used as well.

In this manner, after the semiconductor layer is deposited, the substrate 101 is transferred to the load lock chamber 306 with the robot arm 308 to be stored in the cassette 316.

Note that the aforementioned process is only illustrative, and therefore, a conductive layer and an insulating layer may be continuously formed by using the fourth treatment chamber 305 after forming the semiconductor layer, for example. Further, the number of treatment chambers may be increased. In addition, the formation of the base insulating layer may be preceded by plasma treatment of the substrate 101 so that the surface thereof can be oxidized or nitrided.

In this manner, by using the plasma treatment apparatus shown in this embodiment mode, deposition of a conductive layer, an insulating layer, or a semiconductor layer and plasma treatment thereof can be continuously performed. Therefore, contamination of impurities can be prevented as well as the productivity can be improved.

EMBODIMENT MODE 2

A silicon oxide film which is deposited by plasma CVD with a parallel-plate chamber in which plasma is excited with a frequency of typically 13.56 MHz has a possibility that many defects are produced in the film due to the plasma damage or unreacted gas species during the film deposition. When transistors are manufactured by using such a silicon oxide film, various characteristics such as the threshold voltage or electron field-effect mobility are adversely affected.

Figure 4A:
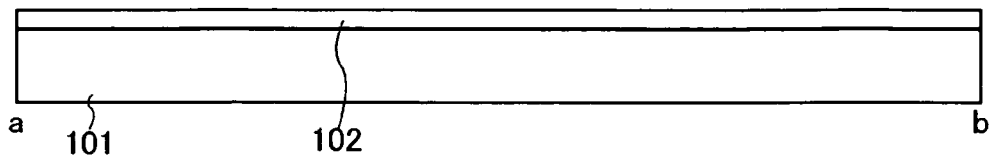
FIGS. 4A to 4E illustrate a manufacturing process of a semiconductor device in accordance with Embodiment Mode 2.

First, as shown in FIG. 4A, a silicon nitride film is formed with a thickness of 50 to 100 nm as a base insulating layer 102 over a substrate 101, by sputtering, low-pressure CVD, or plasma CVD. The silicon nitride film as the base insulating layer 102 is deposited at a substrate temperature of 250 to 400° C., or preferably 300 to 350° C. by supplying a gas of $SiH_4$ and $NH_3$ and/or $N_2$. In this case, a silicon oxynitride film may be used instead of the silicon nitride film. The silicon oxynitride film can be formed by plasma CVD, using a source gas of $SiH_4$, $N_2O$, and $N_2$ and/or $NH_3$. The substrate 101 may be formed with so-called no-alkali glass such as aluminosilicate glass, alumino borosilicate glass, or barium borosilicate glass.

Figure 4B:
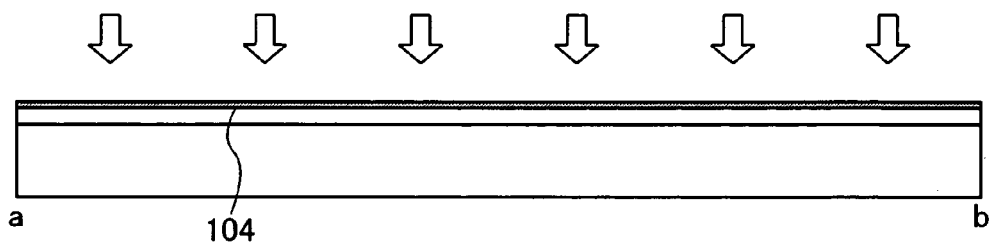

An oxide film is formed on the surface of the base insulating layer 102 by high-density plasma treatment. Accordingly, a plasma-oxidized layer 104 which is produced by the plasma treatment is formed on the surface of the base insulating layer 102 (FIG. 4B). In this case, plasma treatment with microwave excitation is performed by supplying $O_2$ or $N_2O$ together with a rare gas selected from among Ar, Kr, Xe, and Ne into the treatment chamber, thereby the surface of the base insulating layer 102 is oxidized. Nitrogen contained in the silicon nitride film is replaced with oxygen by oxygen radicals (which may include OH radicals in some cases), thereby the plasma-oxidized layer 104 is formed with a thickness of 1 to 10 nm. This plasma-oxidized layer 104 is formed by plasma with an electron temperature of 3 eV or less, or preferably 1.5 eV or less, and an electron density of $1 \times 10^{11}$ cm$^{-3}$ or more; therefore, a high-quality film with a low defect level density is obtained as compared to a silicon oxide film deposited by plasma CVD. Note that the film may contain a rare gas (at least one of He, Ne, Ar, Kr, and Xe) used in the plasma treatment, and in the case where Ar is used, the film may contain Ar.

Figure 4C:
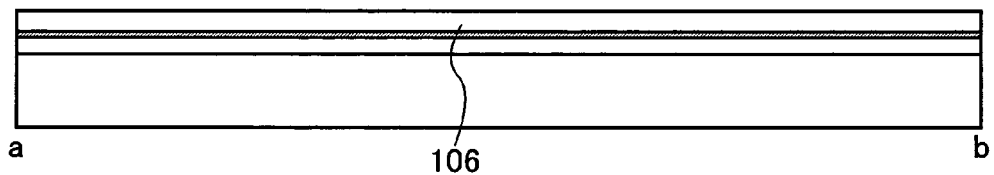
Figure 4D:
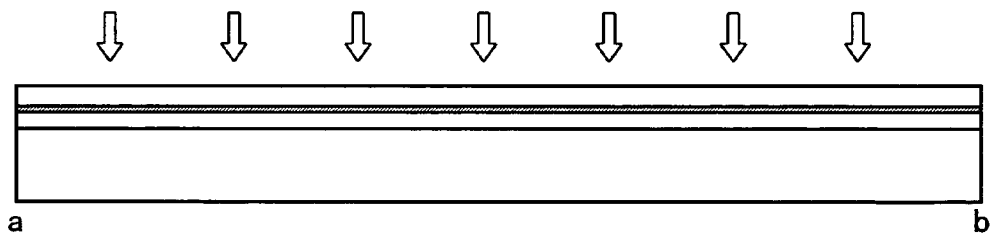

Next, a semiconductor layer 106 containing silicon or containing silicon as a main component (e.g., $Si_xGe_{1-x}$ or the like) is formed over the plasma-oxidized layer 104 by sputtering, low-pressure CVD, or plasma CVD (FIG. 4C). Here, the plasma-oxidized layer 104 and the semiconductor layer 106 can be continuously formed by using the plasma treatment apparatus shown in FIG. 1. By continuously forming the plasma-oxidized layer 104 and the semiconductor layer 106 without exposure to air, contamination of impurities into the semiconductor layer 106 can be prevented.

Description is made below of a structure of the plasma treatment apparatus for realizing the aforementioned process, with reference to FIG. 1. The first treatment chamber 302 is used as a chamber for depositing the base insulating layer 102. In this case, the first treatment chamber 302 has an internal structure as shown in FIG. 3. Alternatively, instead of the deposition method of a thin film using plasma, such a structure may be employed that a silicon nitride film is deposited by decomposing a reactive gas with a heated wire, and thus generating radicals. The second treatment chamber 303 is a chamber for performing high-density plasma treatment, and has an internal structure similar to that shown in FIG. 2. The third treatment chamber 304 is used as a chamber for depositing the semiconductor layer. The internal structure of the third treatment chamber 304 is similar to that shown in FIG. 3. Alternatively, instead of the deposition method of a thin film using plasma, such a structure may be employed that a silicon film is deposited by decomposing a reactive gas with a heated wire, and thus generating radicals. Further, the fourth chamber 305 may have a structure with which the substrate over which the semiconductor layer is deposited is heated with a sheathed heater or a lamp heater at 450 to 600° C. under low pressure, so that dehydrogenation treatment can be performed for removing the hydrogen contained in the semiconductor layer.

It is preferable that the semiconductor layer 106 over the plasma-oxidized layer 104 be crystallized by thermal treatment or irradiation with laser light or strong light. For example, a semiconductor layer, which is obtained by crystallizing a semiconductor layer by irradiation with continuous wave laser beams or pulsed laser beams with a repetition rate of 10 MHz or more, while scanning in one direction, has a characteristic that crystals grow in the scan direction of the beams. By positioning a channel direction of a transistor (a direction in which carriers flow when a channel is formed) along with the scan direction, and combining it with the aforementioned gate insulating layer, such a transistor can be obtained that has small variations in characteristics and has high electron field-effect mobility. Alternatively, metal elements may be added into the semiconductor layer 106, so that thermal treatment at 450 to 750° C. is performed to crystallize the semiconductor layer 106. The crystallization of the semiconductor layer 106 may be performed by combining this crystallization method using thermal treatment with the crystallization method using laser beam irradiation as well.

Figure 4E:
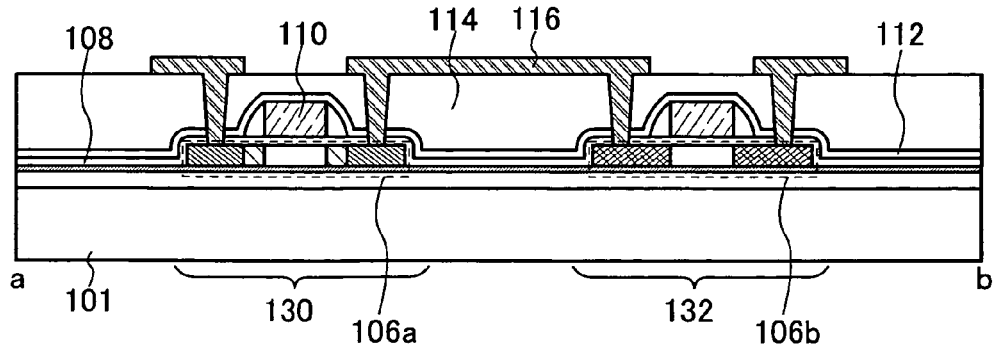

FIG. 4E shows a step of selectively etching the semiconductor layer 106 into island-shaped semiconductor layers 106a and 106b, thereby manufacturing a semiconductor device having an n-channel transistor 130 and a p-channel transistor 132 which respectively use the island-shaped semiconductor layers 106a and 106b as channel formation regions.

A silicon oxide film is formed as a gate insulating layer 108 so as to cover the semiconductor layers 106a and 106b. The gate insulating layer may be formed by using only an insulating layer formed by high-density plasma treatment, or stacking an insulating layer such as silicon oxide, silicon oxynitride, silicon nitride, or the like thereover by CVD using plasma or thermal reaction. In any case, a transistor having a gate insulating layer, a part or all of which is formed with an insulating film formed by high-density plasma treatment, can be reduced in variations of characteristics. The surface of the gate insulating layer 108 may be nitrided by high-density plasma treatment under a nitrogen atmosphere.

After that, a gate electrode 110 is formed by sputtering or the like, using molybdenum (Mo), tungsten (W), chromium (Cr), tantalum (Ta), nickel (Ni), or the like. In the semiconductor layers 106a and 106b, low concentration impurity regions may be formed by providing sidewalls on opposite sides of the respective gate electrodes and performing doping thereto, as well as impurity regions for forming source and drain regions. Further, a passivation layer 112 as a protective layer, an interlayer insulating layer 114, and a wire 116 may be formed.

In this manner, by modifying the surface of the insulating layer functioning as a base film by oxidation or nitridation using plasma treatment, a dense and high-quality film with few defects such as pin holes can be formed as compared to an insulating film formed by CVD or sputtering; therefore, characteristics of semiconductor elements such as transistors can be improved and stabilized.

EMBODIMENT MODE 3

An insulating layer formed between a glass substrate and a semiconductor layer in order to form a crystalline semiconductor layer is provided for the purpose of preventing diffusion of impurities from the substrate into the semiconductor layer as well as planarizing the surface of the glass substrate. Although a silicon nitride film is suitable for a blocking film which serves to prevent diffusion of impurities, it cannot be formed thick because of its high internal stress, so that it cannot increase the planarizing effect. In this embodiment mode, description will be made of an example of forming a base film by effectively using high-density plasma treatment, with reference to FIGS. 5A to 5E.

First, a substrate 101 is prepared, and the surface of the substrate 101 is cleaned with hydrofluoric acid (HF), alkali or pure water. The substrate 101 may be a glass substrate such as barium borosilicate glass, alumino borosilicate glass, or aluminosilicate glass, a quartz substrate, a ceramic substrate, or a metal substrate containing stainless steel. Alternatively, a substrate formed of a flexible synthetic resin may be used, such as plastic typified by polyethlene terephthalate (PET), polyethylene naphthalate (PEN), or polyethersulfone (PES), or acrylic. Description will be made hereinafter of a case of using a glass substrate as the substrate 101.

Figure 5A:
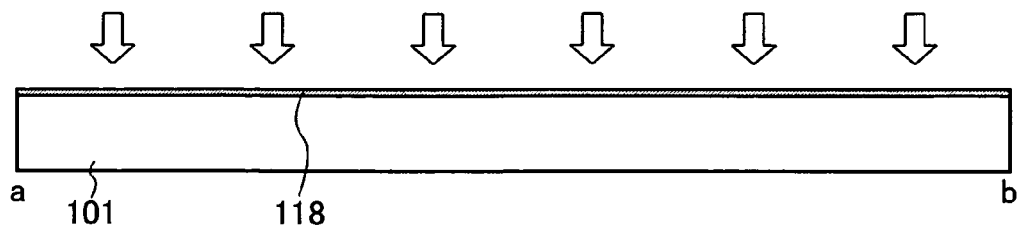
FIGS. 5A to 5E illustrate a manufacturing process of a semiconductor device in accordance with Embodiment Mode 3.

Next, the substrate 101 is nitrided by performing high-density plasma treatment, thereby forming a plasma-nitrided layer 118 on the surface of the substrate 101 (FIG. 5A). The high-density plasma treatment is performed with plasma excited with microwaves, by using a nitrogen source gas such as nitrogen, ammonia, or nitrous oxide and a rare gas (at least one of He, Ne, Ar, Kr, and Xe). The treatment temperature is set preferably at 150 to 400° C., or preferably at 250 to 400° C. The plasma-nitrided layer 118 formed by this high-density plasma treatment is formed to have a thickness of 1 to 10 nm, and typically 3 to 5 nm. The plasma-nitrided layer 118 contains nitride of an element which is the main constituent of the substrate 101 (e.g., silicon, aluminum, boron, barium, or the like). In particular, when the plasma-nitrided layer 118 contains silicon nitride as a main component, it can function as a blocking layer against diffusion of impurities.

Figure 5B:
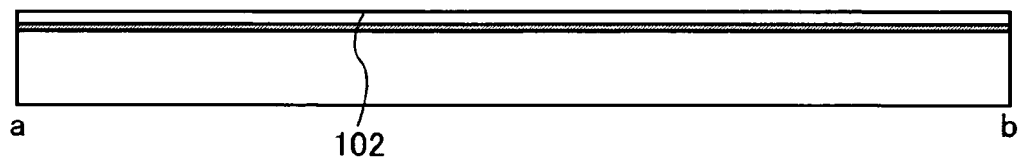

Next, a base insulating layer 102 functioning as a base film is formed over the plasma-nitrided layer 118 (FIG. 5B). The base insulating layer 102 is formed to have a single-layer structure or a stacked-layer structure of an insulating layer such as silicon oxide ($SiO_x$) and silicon oxynitride ($SiO_xN_y$) (x>y) by sputtering, low-pressure CVD, or plasma CVD. The base insulating layer 102 containing silicon oxide as a main component is formed with a thickness of 50 to 150 nm, in order to planarize the surface as well as relieving stress.

Figure 5C:
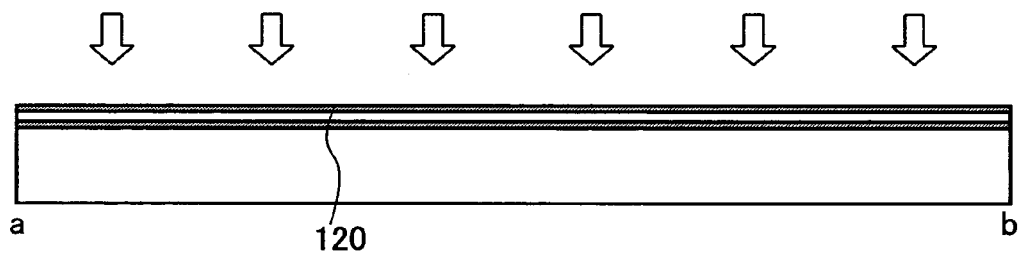

Further, a plasma-nitrided layer 120 may be formed on the surface of the base insulating layer 102 by performing high-density plasma treatment in a similar manner to the treatment of the surface of the substrate 101 (FIG. 5C). In this case, plasma treatment with microwave excitation is performed by supplying one or more gas elements selected from among nitrogen, ammonia, and nitrous oxide together with a rare gas selected from among Ar, Kr, Xe, and Ne, thereby the surface of the base insulating layer 102 containing silicon oxide as a main component is nitrided. Oxygen contained in the silicon oxide film is replaced with nitrogen by nitrogen radicals (which may include NH radicals in some cases), thereby the plasma-nitrided layer 120 is formed with a thickness of 1 to 5 nm. This plasma-nitrided layer 120 is formed by plasma with an electron temperature of 3 eV or less, or preferably 1.5 eV or less, and an electron density of $1\times10^{11}$ cm$^{-3}$ or more; therefore, a high-quality film with a low defect level density can be obtained as compared to a silicon nitride film deposited by plasma CVD. Note that the film may contain a rare gas (at least one of He, Ne, Ar, Kr, and Xe) used in the plasma treatment, and in the case where Ar is used, the film may contain Ar. That is, by forming the plasma-nitrided layer 120 to have a thickness of 1 to 5 nm, effects of fixed charges in the silicon nitride film or effects of stress can be excluded, thereby a favorable interface can be formed between the plasma-nitrided layer 120 and a semiconductor layer formed thereon.

Figure 5D:
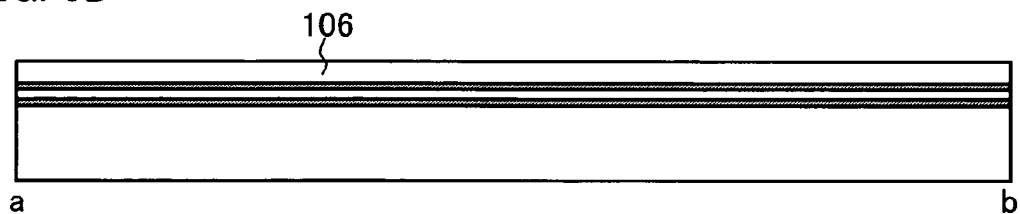

Next, a semiconductor layer 106 containing silicon or containing silicon as a main component (e.g., $Si_xGe_{1-x}$ or the like) is formed over the plasma-nitrided layer 120, by sputtering, low-pressure CVD, or plasma CVD (FIG. 5D). Here, the plasma-nitrided layer 120 and the semiconductor layer 106 can be continuously formed by using the plasma treatment apparatus shown in FIG. 1. By continuously forming the plasma-nitrided layer 120 and the semiconductor layer 106 without exposure to air, contamination of impurities into the semiconductor layer 106 can be prevented.

Description is made below of a structure of the plasma treatment apparatus for realizing the aforementioned process, with reference to FIG. 1. The first treatment chamber 302 is used as a chamber for depositing the base insulating layer 102. In this case, the first treatment chamber 302 has an internal structure as shown in FIG. 3. Alternatively, instead of the deposition method of a thin film using plasma, such a structure may be employed that a silicon nitride film is deposited by decomposing a reactive gas with a heated wire, and thus generating radicals. The second treatment chamber 303 is a chamber for performing high-density plasma treatment, and has an internal structure similar to that shown in FIG. 2. The third treatment chamber 304 is used as a chamber for depositing the semiconductor layer. The internal structure of the third treatment chamber 304 is similar to that shown in FIG. 3. Alternatively, instead of the deposition method of a thin film using plasma, such a structure may be employed that a silicon nitride film is deposited by decomposing a reactive gas with a heated wire, and thus generating radicals. Further, the fourth chamber 305 may have a structure with which the substrate over which the semiconductor layer is deposited is heated with a sheathed heater or a lamp heater at 450 to 600° C. under low pressure, so that dehydrogenation treatment can be performed for removing the hydrogen contained in the semiconductor layer.

Figure 5E:
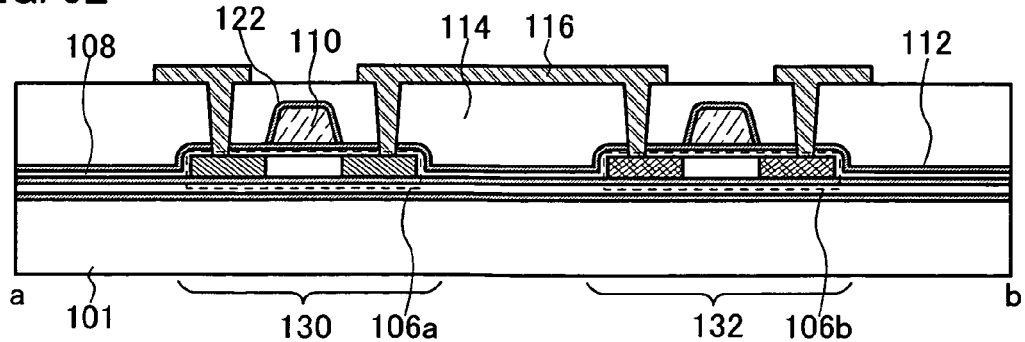

Next, by selectively etching the semiconductor layer 106 into island-shaped semiconductor layers 106a and 106b, a semiconductor device can be formed, which includes an n-channel transistor 130 and a p-channel transistor 132 which respectively use the island-shaped semiconductor layers 106a and 106b as channel formation regions (FIG. 5E). Here, a glass substrate is used as the substrate 101, and the surface of the substrate is nitrided by performing plasma treatment under a nitrogen atmosphere, thereby forming the plasma-nitrided layer 118. Then, silicon oxide ($SiO_x$) is formed as the base insulating layer 102 over the plasma-nitrided layer 118, and the plasma-nitrided layer 120 is formed on the base insulating layer 102 by high-density plasma treatment. Then, silicon oxide is formed as a gate insulating layer 108 so as to cover the semiconductor layers 106a and 106b, and the gate insulating layer 108 is nitrided by plasma treatment under a nitrogen atmosphere. After that, a gate electrode 110 is formed by sputtering or the like, using molybdenum (Mo), tungsten (W), chromium (Cr), tantalum (Ta), nickel (Ni), or the like, and the surface of the gate electrode 110 is nitrided by performing plasma treatment under a nitrogen atmosphere. For example, when molybdenum (Mo) is used as the gate electrode 110, a metal nitride layer 122 is formed on the surface of the Mo. Although molybdenum (Mo) is easily oxidized in general when used as the gate electrode 110, the molybdenum (Mo) can be prevented from being oxidized when the surface of the molybdenum (Mo) is nitrided by performing plasma treatment under a nitrogen atmosphere thereto.

In this manner, by oxidizing or nitriding the surface of the substrate 101 by plasma treatment, contamination of semiconductor elements can be prevented, which would otherwise be caused by diffusion of impurity elements such as alkaline metals typified by sodium (Na) or alkaline earth metals contained in the substrate.

EMBODIMENT MODE 4

In this embodiment, description will be made of a method for forming a gate insulating layer which can suppress a leakage current at an edge of a semiconductor layer formed with an island shape, with reference to FIGS. 6A to 6D.

Figure 6A:
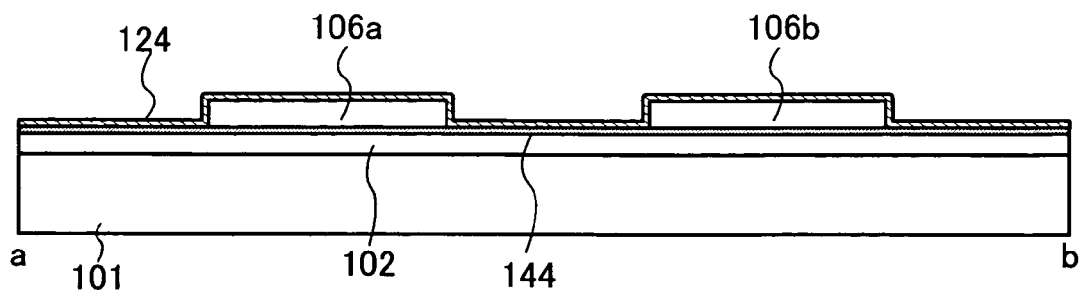
FIGS. 6A to 6C illustrate a manufacturing process of a semiconductor device in accordance with Embodiment Mode 4.

Referring to FIG. 6A, a base insulating layer 102, a plasma-oxidized layer 144, and semiconductor layers 106a and 106b are formed over a substrate 101 similarly to Embodiment Mode 2, and then a silicon nitride layer 124 is formed with a thickness of 1 to 5 nm by plasma CVD. In this case, the silicon nitride layer 124 is deposited so that the layer contains a high concentration of silicon. As the conditions for forming a silicon nitride film containing a high concentration of silicon, for example, $SiH_4$ and $NH_3$ and/or $N_2$ is used as a reactive gas, electric discharge power is set low, and reaction pressure is set high. In this case, a flow ratio of $SiH_4$ and $NH_3$ is preferably set about 0.15 ($SiH_4/NH_3$=0.15). In addition, nitrogen may be mixed into the reactive gas. The silicon nitride film containing a high concentration of silicon which is deposited with such film deposition conditions is improved in step coverage. That is, a silicon nitride film can also be deposited on side surfaces of the semiconductor layers 106a and 106b which are formed with a thickness of 20 to 100 nm, to have a thickness of 70% or more of flat portions like the surface of the insulating substrate.

Figure 6B:
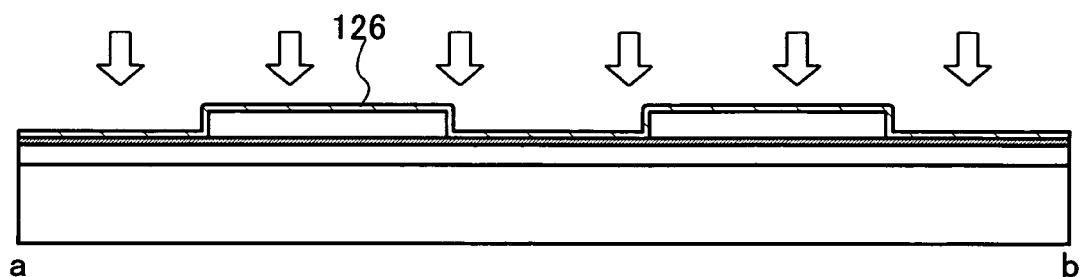

Referring to FIG. 6B, plasma with a low electron temperature (3 eV or less, or preferably 1.5 eV or less) and a high electron density ($1\times10^{11}$ cm$^{-3}$ or more) is generated with microwave excitation by supplying a gas containing oxygen such as oxygen or nitrous oxide. With oxygen radicals (which may include OH radicals in some cases) produced with this high-density plasma, the silicon nitride layer 124 containing a high concentration of silicon is oxidized. By this plasma treatment, a plasma-oxidized layer 126 is formed, which corresponds to a layer in which nitrogen in the silicon nitride layer 124 is replaced with oxygen and thus is oxidized. Silicon contained in the silicon nitride layer 124 is also oxidized. This plasma-oxidized layer 126 can be used as a gate insulating layer of a field effect transistor.

The plasma-oxidized layer 126 is obtained by oxidizing the silicon nitride layer 124 which is deposited so as to cover the top surface and side surfaces of the island-shaped semiconductor layers 106a and 106b with high coverage, by high-density plasma treatment. Since the oxidation reaction in this case is a solid-phase reaction, the interface state density between the silicon oxide layer and the semiconductor layer can be controlled extremely low. In addition, since it can be prevented that the oxidation progresses more than necessary at a crystal grain boundary of polycrystalline silicon, an excellent state can be obtained. That is, by solid-phase oxidizing the surface of the semiconductor layer by the high-density plasma treatment shown herein, it can be prevented that an abnormal oxidation reaction occurs at the crystal grain boundary, and thus a uniform silicon oxide film with a low interface state density can be formed on the top surface and side surfaces of the semiconductor layers.

Figure 6C:
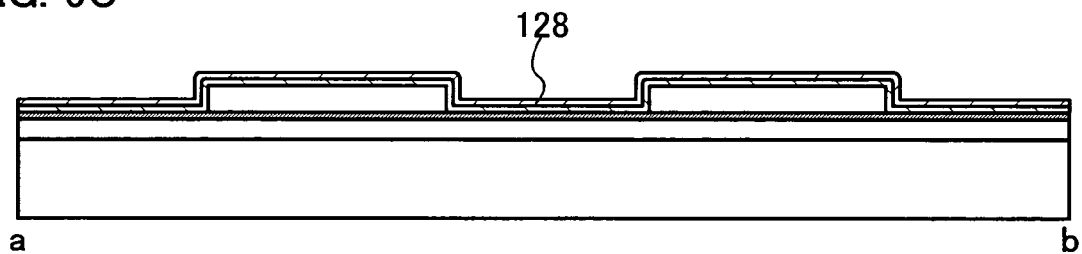

In addition, as shown in FIG. 6C, an insulating layer, for example a silicon oxide layer 128 may be stacked by plasma CVD, over the plasma-oxidized layer 126 which is produced by plasma treatment. The thickness of a gate insulating layer is required to be determined in consideration of the driving voltage of the transistor (in accordance with the scaling law). In the case where the plasma-oxidized layer 126 produced by plasma treatment does not have a sufficient thickness for a gate insulating layer, the thickness thereof can be controlled by stacking the silicon oxide layer 128 thereover by plasma CVD as described above. Note that as for a transistor driven with a voltage of 5 to 15 V, for example, the silicon oxide layer 128 may be deposited with a thickness of 80 nm over the plasma-oxidized layer 126 which is formed with a thickness of 5 nm. Instead of the silicon oxide layer 128, a silicon nitride film or a silicon oxynitride film may be used as well.

Description is made below of a structure of the plasma treatment apparatus for realizing the aforementioned process, with reference to FIG. 1. The first treatment chamber 302 is used as a chamber for depositing the base insulating layer 102. In this case, the first treatment chamber 302 has an internal structure as shown in FIG. 3. Alternatively, instead of the deposition method of a thin film using plasma, such a structure may be employed that a silicon nitride film is deposited by decomposing a reactive gas with a heated wire, and thus generating radicals. The second treatment chamber 303 is a chamber for performing high-density plasma treatment, and has an internal structure similar to that shown in FIG. 2. The third treatment chamber 304 is used as a chamber for depositing the silicon oxide layer 128. The internal structure of the third treatment chamber 304 is similar to that shown in FIG. 3. In the case of depositing other insulating layers such as a silicon oxynitride film instead of the silicon oxide layer, the kind of reactive gas to be supplied into the treatment chamber is only required to be changed. The fourth treatment chamber 305 may be used as a chamber for sputtering or a chamber for depositing a conductive layer to form a gate electrode. In any case, such a plasma treatment apparatus allows the continuous formation of an insulating layer to be a gate insulating layer over a clean surface of a semiconductor layer up to the stage of forming a gate electrode without exposure to air.

After that, a gate electrode 110 is formed by sputtering or the like, using molybdenum (Mo), tungsten (W), chromium (Cr), tantalum (Ta), nickel (Ni), or the like. In the semiconductor layers 106a and 106b, low concentration impurity regions may be formed by providing sidewalls on opposite sides of the respective gate electrodes and performing doping thereto, as well as impurity regions for forming source and drain regions. Further, a passivation layer 112 as a protective layer, an interlayer insulating layer 114, and a wire 116 may be formed.

In this manner, by modifying the surface of the insulating layer functioning as a base film by nitridation or oxidation using plasma treatment, a dense and a high-quality film with few defects such as pin holes can be formed as compared to an insulating film formed by CVD or sputtering; therefore, characteristics of semiconductor elements such as transistors can be improved and stabilized.

EMBODIMENT MODE 5

In this embodiment mode, description will be made of a manufacturing process of a semiconductor device having a structure where a silicon oxide film, a silicon nitride film, and a silicon oxynitride film are sequentially stacked, with reference to drawings.

Figure 7A:
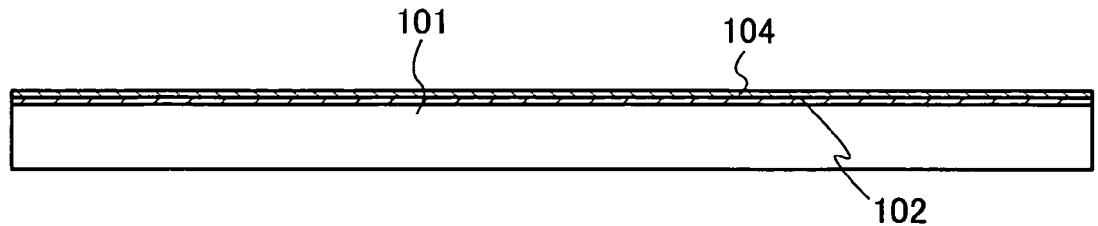
FIGS. 7A to 7D illustrate a manufacturing process of a semiconductor device in accordance with Embodiment Mode 5.

FIG. 7A shows a step of forming a base film. A base insulating layer 102 and a plasma-oxidized layer 104 are formed as a base insulating layer over a substrate 101, in a similar manner to Embodiment Mode 2. The structure of the base insulating layer may be the same as that in Embodiment Mode 3 as well.

Figure 7B:
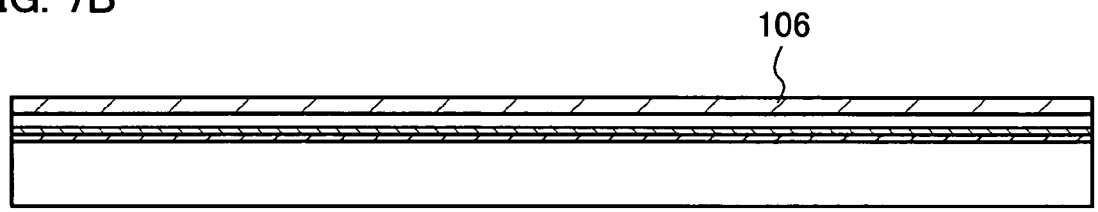

FIG. 7B shows a step of forming a semiconductor layer. A semiconductor layer 106 is a crystalline semiconductor layer which is obtained by forming an amorphous semiconductor layer, and crystallizing it by laser crystallization, thermal crystallization by RTA (Rapid Thermal Annealing) or by use of an annealing furnace, thermal crystallization using metal elements which promote crystallization, or a method combining them.

The crystallization which is employed as a preferable method herein is performed by irradiating the semiconductor layer with continuous wave laser beams or pulsed laser beams along with beam scanning. As a laser oscillator, one or more of the following can be used: a gas laser such as an Ar laser, a Kr laser, or an excimer laser; a single crystalline laser such as YAG, YVO$_4$, forsterite (Mg$_2$SiO$_4$), YAlO$_3$, GdVO$_4$ or a polycrystalline (ceramic) laser such as YAG, Y$_2$O$_3$, YVO$_4$, YAlO$_3$, or GdVO$_4$, which is doped with one or more mediums selected from among Nd, Yb, Cr, Ti, Ho, Er, Tm, and Ta; a glass laser; a ruby laser; an alexandrite laser; and a Ti:sapphire laser. By irradiating the semiconductor layer with the fundamental wave of such laser beams or second to fourth harmonics of the fundamental wave, crystals with a large grain size can be obtained. For example, the second harmonic (532 nm) or the third harmonic (355 nm) of an Nd:YVO$_4$ laser (fundamental wave: 1064 nm) may be employed.

Note that the single crystalline laser such as YAG, YVO$_4$, forsterite (Mg$_2$SiO$_4$), YAlO$_3$, GdVO$_4$ or the polycrystalline (ceramic) laser such as YAG, Y$_2$O$_3$, YVO$_4$, YAlO$_3$, or GdVO$_4$, which is doped with a one or more mediums selected from among Nd, Yb, Cr, Ti, Ho, Er, Tm, and Ta; the Ar laser; or the Ti:sapphire laser can perform continuous oscillation, and also perform pulse oscillation with a repetition rate of 10 MHz or more when combined with a Q-switch operation or mode locking.

Laser beams oscillated in a pulsed manner in such a laser oscillator are converted in wavelength into a second harmonic or a third harmonic with the use of a non-linear optical device, so that the semiconductor layer is irradiated with the laser beams to be crystallized. When the semiconductor layer is irradiated with pulsed laser beams with a repetition rate of 10 MHz or more, or preferably in the range of 10 MHz to 100 GHz, and a pulse width of ct<4nd (where c: light velocity, t: pulse width, n: refractive index of a substrate to serve as a support of the semiconductor layer, and d is the thickness of the substrate), or preferably ct<2nd (e.g., a pulse width of 1 nsec or less), the semiconductor layer is irradiated with the next pulse after it is fused by the present laser by the time it is solidified. Thus, unlike the case of using a pulsed laser with a low repetition rate, a solid-liquid interface can be continuously moved in the semiconductor layer; therefore, crystal grains which continuously grow in the scan direction can be obtained.

In addition, when ceramic (polycrystal) is used as a medium, the medium can be formed into a desired shape in a short time at low cost. In the case of using ceramic as a medium, the size of the medium can be considerably increased as compared to single crystals; therefore, drastic improvement of outputs can be expected. In the case of using ceramic as a medium, it can be easily formed into the shape of a parallelepiped or a rectangular parallelepiped; therefore, a laser beam emitted from a medium with such a shape has a square cross section at the time of emission. Thus, it is advantageous for being shaped into a linear beam as compared to a circular beam. By shaping a laser beam emitted in this manner with the use of an optical system, a liner beam having a short side of 1 mm or less and a long side of several millimeters to several meters can be easily obtained.

Figure 7C:
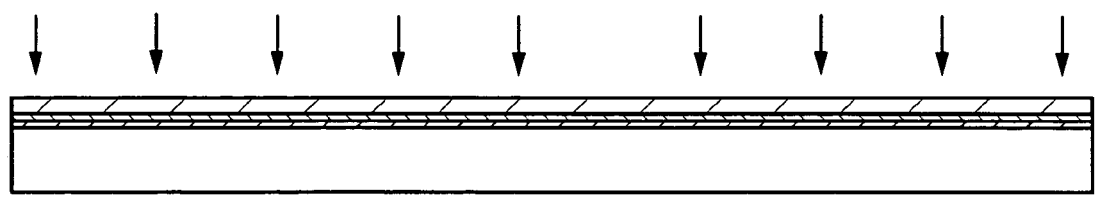

FIG. 7C shows a step of doping the semiconductor layer 106 with impurities which impart one conductivity type, which is performed as required in order to control the threshold voltage of a transistor. For example, the semiconductor layer 106 is doped with boron as p-type impurity elements.

Figure 7D:
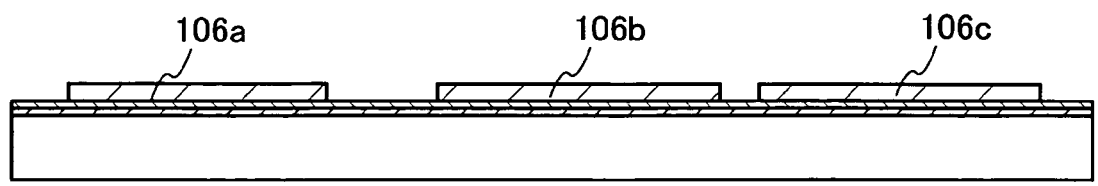

FIG. 7D shows a step of etching the semiconductor layer 106. The semiconductor layer 106 is selectively etched to form semiconductor layers 106a, 106b, and 106c. Here, the semiconductor layer 106a is used to form a memory element, while the semiconductor layers 106b and 106c are used for a logic circuit.

Figure 8A:
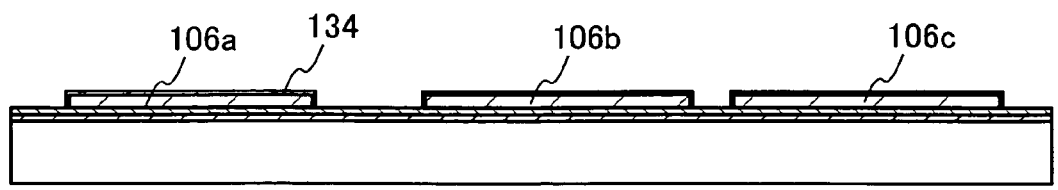
FIGS. 8A to 8C illustrate a manufacturing process of a semiconductor device in accordance with Embodiment Mode 5.

FIG. 8A shows a first step of forming a gate insulating layer. Plasma treatment is performed to the semiconductor layers 106a, 106b, and 106c, thereby forming a plasma-oxidized layer 134 with a thickness of 1 to 10 nm. This plasma treatment is performed in a similar manner to that in Embodiment Mode 4. Here, plasma treatment is performed in an atmosphere containing oxygen, so that each surface of the semiconductor layers 106a, 106b, and 106c is oxidized. Accordingly, the plasma-oxidized layer 134 is formed. In this case, as the plasma-oxidized layer 134, the silicon oxide film may be replaced with a silicon oxynitride film ($SiO_xN_y$, where x>y). A silicon oxide film or a silicon oxynitride film formed by plasma CVD or sputtering has defects inside the film, and thus is not sufficient in film quality. Therefore, by oxidizing the semiconductor layer by performing plasma treatment under an oxygen atmosphere, an insulating layer which is denser than an insulating layer formed by CVD or sputtering can be formed. In addition, in the case of providing a conductive layer over the semiconductor layer by CVD or sputtering, with the insulating layer interposed therebetween, there is a possibility of causing a short between the semiconductor layer and the conductive layer, which results from the state that an edge of the semiconductor layer is not sufficiently covered with the insulating layer. However, by oxidizing or nitriding the surface of the semiconductor layer by plasma treatment, such a coverage defect at the edge of the semiconductor layer can be prevented.

Figure 8B:
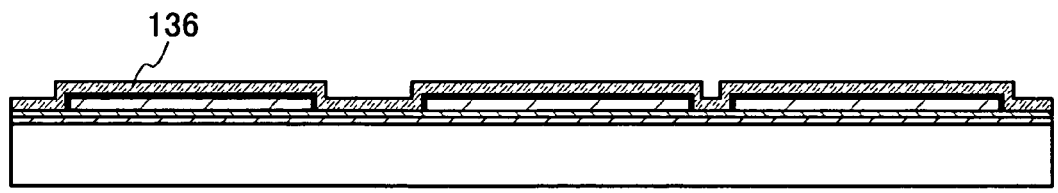

FIG. 8B shows a second step of forming a gate insulating layer. A silicon nitride layer 136 is formed with a thickness of 5 to 50 nm so as to cover the silicon oxide film formed as the plasma-oxidized layer 134 and the base film. In this case, the silicon nitride film may be replaced with a silicon nitride oxide film ($SiN_xO_y$, where x>y). In any case, an insulating layer containing nitrogen as a main component is formed. The silicon nitride film for forming the silicon nitride layer 136 is preferably formed to contain cluster-state silicon. That is, an element for constructing a nonvolatile memory can be provided by creating such a condition that the silicon nitride film can hold electric charges. In this case, the silicon nitride film is deposited in such a manner that a cluster of silicon is included therein. As the film deposition conditions, for example, silane and ammonia and/or hydrogen is used as a reactive gas, electric discharge power is set low, and reaction pressure is set high. In this case, a flow ratio of silane and ammonia is preferably set about 0.15 ($SiH_4/NH_3$=0.15). In addition, nitrogen may be mixed into the reactive gas.

Further, conductive particles or semiconductor particles (hereinafter referred to as "dispersed particles") may be formed over the plasma-oxidized layer 134 in order to provide a function of holding electric charges. As a method for forming the dispersed particles, known methods can be used, such as sputtering, plasma CVD, low pressure CVD, vapor deposition, or a droplet discharge method. The size of each dispersed particles is preferably 0.1 to 10 nm, or preferably 2 to 5 nm. As a material of the semiconductor particles, silicon (Si), germanium (Ge), a silicon-germanium alloy, or the like can be used. In addition, microcrystals of silicon can be used as the dispersed particles as well. Further, the surface of the dispersed particles may be oxidized or nitrided by performing plasma treatment under an oxygen atmosphere or a nitrogen atmosphere. Note that a conductive layer may be provided in addition to the dispersed particles.

Figure 8C:

FIG. 8C shows a third step of forming a gate insulating layer. Plasma treatment is performed to the silicon nitride layer 136 in an oxygen atmosphere. By this plasma treatment, nitrogen in the silicon nitride layer 136 is replaced with oxygen, thereby a plasma-oxidized layer 138 is formed. In addition, cluster-state silicon in the silicon nitride layer 136 is also oxidized. A silicon oxide film which is formed as the plasma-oxidized layer 138 by the plasma treatment is formed to have a thickness of 2 to 10 nm.

Figure 9A:
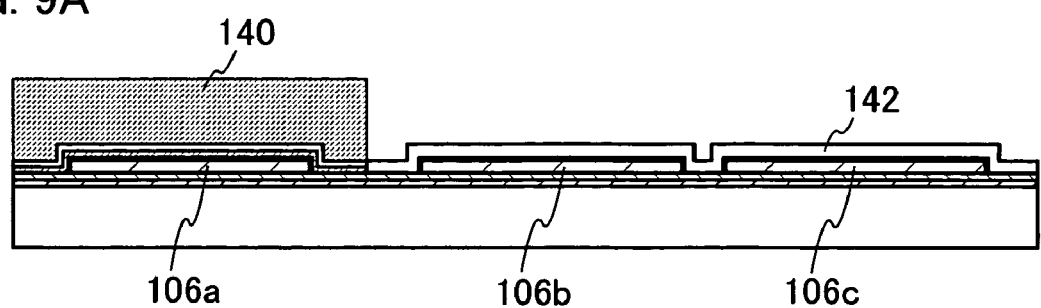
FIGS. 9A to 9C illustrate a manufacturing process of a semiconductor device in accordance with Embodiment Mode 5.

FIG. 9A shows a step of selectively oxidizing the silicon nitride layer 136 in a logic portion. Specifically, the silicon nitride film 136 in the logic portion is oxidized by performing plasma treatment in an oxygen atmosphere. In this case, a region where the semiconductor layer 106a is formed is provided with a mask 140, so as not to be exposed to plasma. By this plasma treatment, nitrogen is replaced with oxygen in the silicon nitride film in regions where the semiconductor layers 106b and 106c are formed, thereby a silicon oxide layer 142 is formed as an insulating layer.

Description is made below of a structure of the plasma treatment apparatus for realizing the aforementioned process, with reference to FIG. 1. The first treatment chamber 302 is a chamber for performing high-density plasma treatment, which has an internal structure similar to that shown in FIG. 2. In the first treatment chamber 302, nitridation treatment of a semiconductor layer is performed. The second treatment chamber 303 is used as a chamber for depositing the base insulating layer 102. In this case, the internal structure of the second treatment chamber 303 is similar to that shown in FIG. 3. The third treatment chamber 304 is a chamber for performing high-density plasma treatment, which has an internal structure similar to that shown in FIG. 2. In the third treatment chamber 304, oxidation treatment of a silicon nitride film is performed. The fourth treatment chamber 305 may be prepared as a chamber for performing high-density plasma treatment. In any case, such a plasma treatment apparatus allows the continuous formation of an insulating layer to be a gate insulating layer over a clean surface of a semiconductor layer without exposure to air.

Figure 9B:
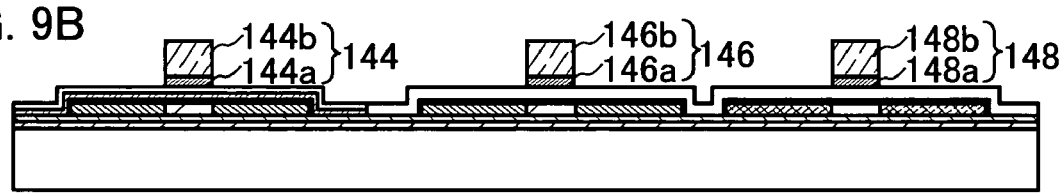

FIG. 9B shows a step of forming a gate electrode. After removing the mask 140 in FIG. 9A, gate electrodes 144, 146, and 148 are respectively formed over the semiconductor layers 106a, 106b, and 106c. The example shown herein is the case of forming the gate electrodes 144, 146, and 148 by stacking first conductive layers 144a, 146a, and 148a, and second conductive layers 144b, 146b, and 148b. The first conductive layers 144a, 146a, and 148a are preferably formed with metals selected from among tantalum (Ta), tungsten (W), titanium (Ti), molybdenum (Mo), chromium (Cr), and niobium (Nb), or nitride of such metals. As the metal nitride, there is tantalum nitride, titanium nitride, tungsten nitride, molybdenum nitride, or the like, for example. This is in order to increase the adhesion to the second conductive layers 144b, 146b, and 148b, as well as preventing oxidation. The second conductive layers 144b, 146b, and 148b can be typically formed with metals selected from among tantalum (Ta), tungsten (W), titanium (Ti), molybdenum (Mo), aluminum (Al), copper (Cu), chromium (Cr), and niobium (Nb), or an alloy or compound material containing such metals as a main component. In addition, the second conductive layers 144b, 146b, and 148b may be formed with a semiconductor material typified by polycrystalline silicon doped with impurity elements such as phosphorus.

In FIG. 9B, each semiconductor layer is doped with impurities which impart one conductivity type or the opposite conductivity thereof. The semiconductor layer 106a is doped with n-type impurity elements, using the gate electrode 144 as a mask. The semiconductor layer 106b is doped with p-type impurity elements, using the gate electrode 146 as a mask. The semiconductor layer 106c is doped with n-type impurity elements, using the gate electrode 148 as a mask. The impurity doping of the semiconductor layer is performed by injecting impurity elements which impart one conductivity type or the opposite conductivity thereof, or by injecting ion species containing such elements while accelerating with an electrical field. The ion species to be injected may be either separated in mass or not. In this manner, impurity regions formed in each semiconductor layer form source and drain regions. In this case, a low concentration impurity region may be formed as well by providing a difference in concentration in the impurity regions.

Figure 9C:
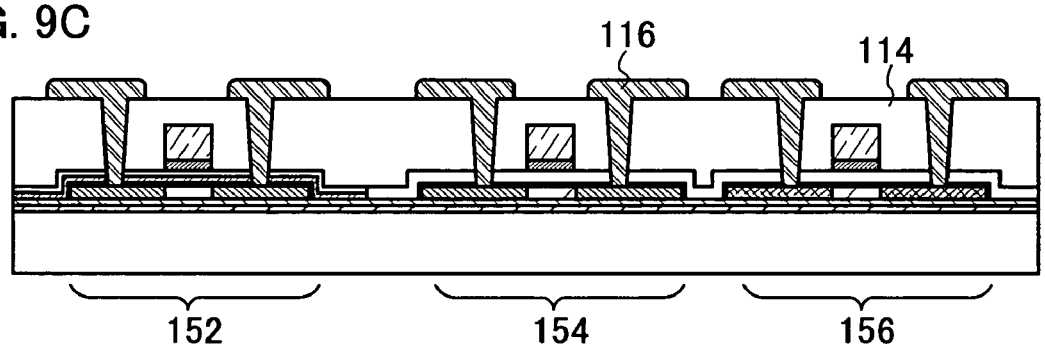

FIG. 9C shows a step of forming an interlayer insulating layer and wires. An interlayer insulating layer 114 is formed covering the gate electrodes 144, 146, and 148, and a wire 116 is formed over the interlayer insulating layer 114 so as to be electrically connected to the source or drain region in each of the semiconductor layers 106a, 106b, and 106c. In this manner, transistors are obtained, where the semiconductor layers 106a, 106b, and 106c, portions of which overlap with the gate electrodes 144, 146, and 148, are used as channel regions.

A transistor 152 which has the silicon nitride layer 136 functioning as a layer for accumulating electric charges between the semiconductor layer 106a and the gate electrode 144 can be operated as a nonvolatile memory element. That is, the silicon nitride film having a function of holding electric charges is included in the gate insulating layer. Transistors 154 and 156 formed in the logic portion are reduced in interface state density by providing the plasma-oxidized layer 134 formed by plasma treatment to have an interface with the semiconductor layers 106b and 106c; therefore, variations in characteristics such as the threshold voltage are suppressed.

As described above, by performing oxidation or nitridation treatment with the use of radicals produced by plasma with a low electron temperature and a high electron density which is excited by microwave excitation, a film deposition step which has conventionally been required can be omitted as well as a favorable interface state can be obtained between the stacked layers formed of different materials, in particular. Further, insulating layers having different functions can be formed over a common substrate.

EMBODIMENT MODE 6

Figure 10A:
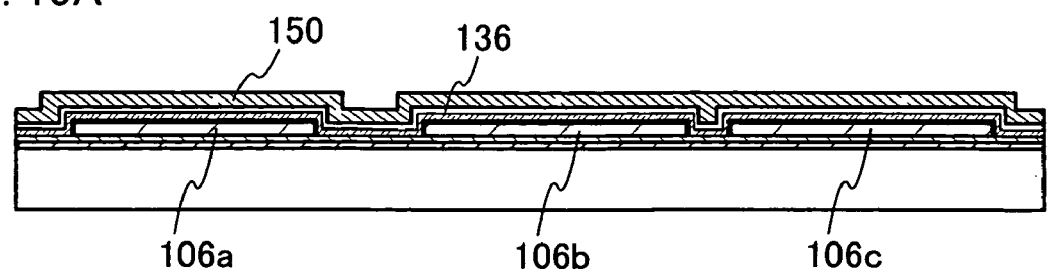
FIGS. 10A to 10C illustrate a manufacturing process of a semiconductor device in accordance with Embodiment Mode 6.
Figure 10B:
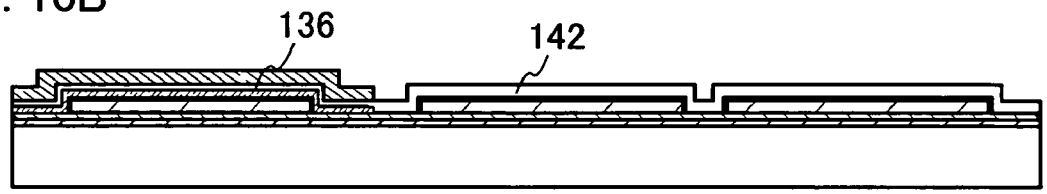
Figure 10C:
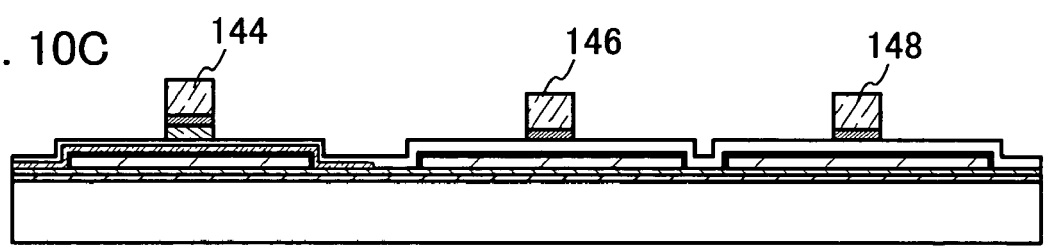

The step of selectively oxidizing the silicon nitride layer 136 shown in FIG. 9A which is described in Embodiment Mode 5 can be replaced with another step. In FIG. 10A, a conductive layer 150 is formed over a top surface of the plasma-oxidized layer 138 formed in the memory portion. Then, as shown in FIG. 10B, etching is performed so that the conductive layer 150 located over the semiconductor layer 106a remains intact, and plasma treatment is performed by supplying an oxygen gas or an oxygen source gas. In this case, since the conductive layer 150 serves as a mask, the silicon nitride layer 136 which is not covered with the conductive layer 150 can be oxidized. There is a possibility that the conductive layer 150 is also oxidized; therefore, tantalum, titanium, molybdenum, or the like which can maintain conductivity even when oxidized is preferably used. After that, as shown in FIG. 10C, a first conductive layer and a second conductive layer may be stacked to form gate electrodes without removing the conductive layer 150. Therefore, a conductive layer to be patterned, which is formed in the memory element portion has a three-layer structure.

EMBODIMENT MODE 7

In this embodiment mode, description will be made of a step of forming a low concentration impurity (LDD) region overlapping with a gate electrode in an n-channel transistor, in the case of downsizing a transistor within the level that a short-channel effect is not caused, with reference to FIGS. 11A to 11D.

First, a base film is formed over a substrate 101 by depositing a silicon nitride film as a base insulating layer 102 and forming a silicon oxide film thereover as a plasma-oxidized layer 104, in a similar manner to Embodiment Mode 2. Further, semiconductor layers 106a and 106b are formed.

High-density plasma treatment is performed to the surface of the semiconductor layers 106a and 106b, in a similar manner to Embodiment Mode 5, thereby forming a plasma-oxidized layer 134 with a thickness of 1 to 10 nm. This plasma-oxidized layer 134 is used as a gate insulating layer of a field effect transistor. Further, an insulating layer such as a silicon oxide film or a silicon nitride film may be stacked over the plasma-oxidized layer 134 by using a film deposition technique such as plasma CVD or sputtering.

Figure 11A:
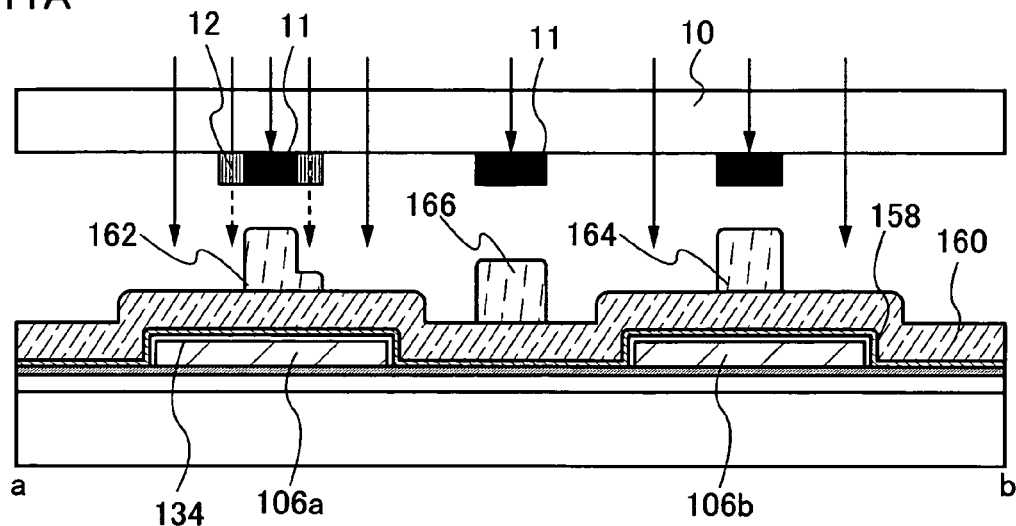
FIGS. 11A to 11D illustrate a manufacturing process of a semiconductor device in accordance with Embodiment Mode 7.

A conductive layer for forming a gate electrode is formed with a single layer or a plurality of layers of conductive layers. In FIG. 11A, a first conductive layer 158 is formed with metals selected from among tantalum (Ta), tungsten (W), titanium (Ti), molybdenum (Mo), chromium (Cr), and niobium (Nb), or nitride of such metals. Typically, when the first conductive layer 158 is formed with metal nitride with a thickness of 30 to 50 nm, it can form a favorable contact with the plasma-oxidized layer 134 located thereunder. That is, the first conductive layer 158 is formed with high adhesion. As the metal nitride, there is tantalum nitride, titanium nitride, tungsten nitride, molybdenum nitride, or the like, for example. A second conductive layer 160 can be typically formed with metals selected from among tantalum (Ta), tungsten (W), titanium (Ti), molybdenum (Mo), aluminum (Al), copper (Cu), chromium (Cr), and niobium (Nb), or an alloy or compound material containing such elements as a main component. The second conductive layer 160 is formed with a thickness of 300 to 600 nm. In addition, the second conductive layer 160 may be formed with a semiconductor material typified by polycrystalline silicon doped with impurity elements such as phosphorus.

Subsequently, a mask pattern is formed for etching the first conductive layer 158 and the second conductive layer 160. The mask pattern is formed by a photolithography step. The mask pattern is formed by using a photomask or a leticle including an auxiliary pattern which is formed of a diffraction grating pattern or a semi-transmissive film having a function of reducing the light intensity. FIG. 11A shows the cross-sections of a mask pattern 162 which is intentionally formed to have a nonuniform thickness in such a manner that a central portion is thicker than opposite end portions (in the channel direction), and mask patterns 164 and 166 which are not intentionally formed to have a nonuniform thickness.

That is, a photomask or reticle 10 used in this photolithography step includes a substrate which transmits sufficient light for exposure of resist, a pattern 11 for blocking the light for exposure, and a halftone pattern 12 with which light exposure can be performed with such a level (gray level) that can provide an incomplete state of light exposure or non-light exposure. Specifically, the photomask or reticle 10 is formed by using diffraction gratings with slits (also called grid) for substantially attenuating the light to be transmitted, or other patterns which can reduce the substantial quantity of light to be transmitted (e.g., a thin film of MoSi). Alternatively, the photomask or reticle 10 may be provided with slits with a resolution limit or less, so that a resist with the complex shape is formed. In addition, the mask pattern may be transformed by performing baking at a temperature with which the shape of the resist is changed (e.g., 200° C.), after a developing step.

Shapes of the mask patterns 162 and 164 can be reflected in etching the first conductive layer 158 and the second conductive layer 160 by using the mask patterns. For example, the shape of the mask pattern 162 can be reflected in the shapes of the first conductive layer and the second conductive layer after being etched. This is because the mask pattern is also etched to some extent in the etching process. When such an effect is effectively utilized, a plurality of patterns with different cross-sectional shapes can be formed at the same time by one photolithography step (one light exposure). In FIG. 11A, the mask pattern 162 is used for forming a gate electrode of an n-channel transistor, the mask pattern 164 is used for forming a gate electrode of a p-channel transistor, and the mask pattern 166 is used for forming a gate wire which is formed at the same time as a gate electrode, while being connected thereto.

An illustrative example is described herein, where a tantalum nitride film is formed as the first conductive layer 158, while a tungsten film is formed as the second conductive layer 160. As an etching gas used for dry-etching the tungsten film as the second conductive layer 160, $CF_4$, $SF_6$, $Cl_2$, and $O_2$ are used. In order to increase the etching rate, a dry etching apparatus using a high-density plasma source such as an ECR (Electron Cyclotron Resonance) or an ICP (Inductively Coupled Plasma) may be used. In addition, in order to process the second conductive layer 160 to have tapered edges or tapered sidewalls with the use of the mask patterns 162 and 164, a negative bias voltage is applied to the substrate side. Then, the tantalum nitride film as the first conductive layer 158 is etched by switching the etching gas to $CF_4$ and $Cl_2$.

Next, $BCl_3$, $Cl_2$, and $O_2$ are used as the etching gas, and the first conductive layer 158 is selectively etched using the mask patterns. The mask patterns 162 and 164 formed of resist are sputtered with ions which are accelerated with an electric field, and thus the size is further reduced. In this etching, a bias voltage applied to the substrate side is set low, so that the first conductive layer remains intact. Edges of the second conductive layer are recessed inward than the first conductive layer.

Figure 11B:
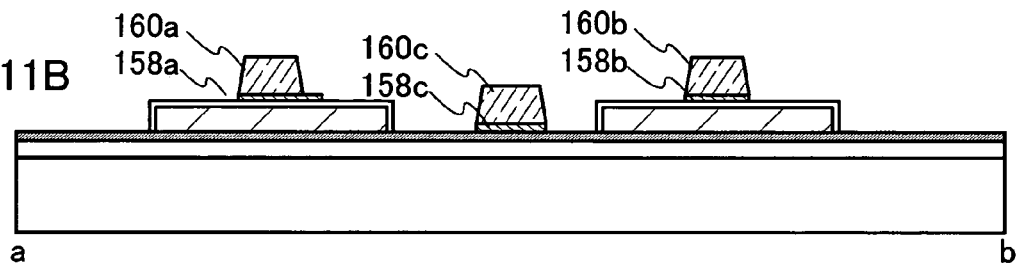

In this manner, as shown in FIG. 11B, a pattern of a first conductive stack, which is composed of a first conductive layer 158a and a second conductive layer 160a, is formed over the semiconductor layer 106a to form an n-channel transistor. A projection at the edge of the first conductive layer will be reflected in the structure of a low concentration impurity (LDD) region which is to be formed in a self-aligned manner in the subsequent step. In this case, the dimension of the projection can be freely set in consideration of the driving conditions of the n-channel transistor and the like. In addition, a pattern of a second conductive stack, which is composed of a first conductive layer 158b and a second conductive layer 160b, is formed over the semiconductor layer 106b to form a p-channel transistor. This pattern does not have such a shape that the first conductive layer 158b projects. The same can be said for a wire pattern formed with a first conductive layer 158c and a second conductive layer 160c.

Figure 11C:
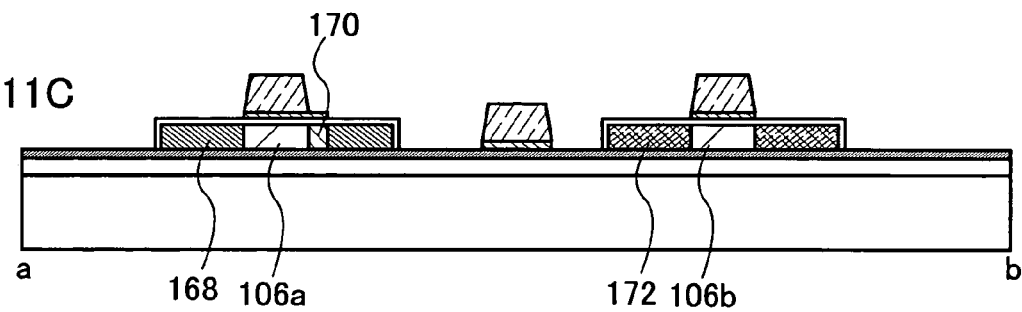

FIG. 11C shows a state in which an impurity region having one conductivity type or the opposite conductivity thereof is formed in the semiconductor layer. An n-type impurity region 168 for forming a source or a drain and a low concentration impurity region 170 are formed in the semiconductor layer 106a for forming an n-channel transistor. The low concentration impurity region 170 is doped with n-type impurities (e.g., phosphorus) by using the second conductive layer 160a as a mask. The n-type impurity region 168 for forming a source or a drain is doped with n-type impurities by using the first conductive layer 158a and the second conductive layer 160a as masks. Thus, the low concentration impurity region 170 is formed in a part of the semiconductor layer 106a which overlaps with the first conductive layer 158a. That is, a low concentration impurity region which overlaps with the gate electrode is formed. In addition, a p-type impurity region 172 for forming a source or a drain is formed in the semiconductor layer 106b for forming a p-channel transistor.

Figure 11D:
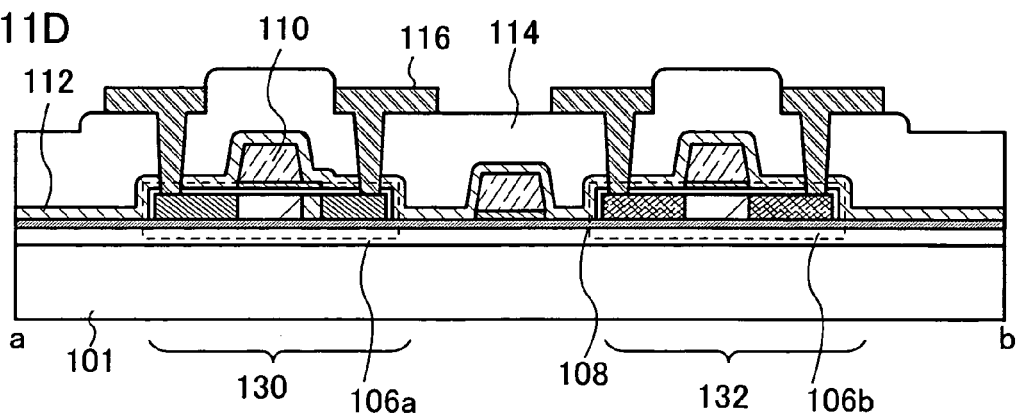

After that, a passivation layer 112, an interlayer insulating layer 114, and a wire 116 may be formed as shown in FIG. 11D.

In this manner, by using a photomask or a leticle including an auxiliary pattern which is formed of a diffraction grating pattern or a semi-transmissive film having a function of reducing the light intensity, a gate electrode and a low concentration impurity region can be formed with flexible designs in consideration of the driving conditions of the transistors. That is, transistors having different driving conditions such as a driving voltage or polarity (conductivity) can be formed over a common substrate in accordance with the operating characteristics. Further, since a gate electrode and a wire formed in the same layer as the gate electrode can be formed to have different cross-sectional shapes, the density of the wire can be increased.

EMBODIMENT MODE 8

Description will be made of a method of forming a plurality of pixels, a driver circuit for inputting signals to the pixels, and a logic circuit for processing video signals, performing complex arithmetic operations, processing data based on programs, storing data, and the like, over a common insulating surface, with reference to drawings.

As an illustrative example of a manufacturing method of a pixel, a manufacturing method of a pixel with a structure shown in FIG. 12A is described below. In FIG. 12A, a pixel is provided at an intersection of a gate electrode (gate wire) 210 and a signal line 224, and the pixel includes a switching transistor 234, a driving transistor 236, a capacitor 238, and a light-emitting element 240. In addition, power is supplied to the pixel from a power supply line 228. One of either a source or a drain of the switching transistor 234 is connected to the signal line 224, while the other is connected to a gate of the driving transistor 236 and one of a pair of electrodes of the capacitor 238. The other of the pair of electrodes of the capacitor 238, and one of either a source and a drain of the driving transistor 236 are connected to the power supply line 228. The other of the source or the drain of the driving transistor 236 is connected to the light-emitting element 240. The example shown herein is the case where an n-channel transistor is used as the switching transistor 234 and a p-channel transistor is used as the driving transistor 236. The light-emitting element 240 has a pair of electrodes, and emits light when a current flows between the pair of electrodes. This embodiment mode describes a manufacturing method of up to the stage of forming a pixel electrode 232 as one of the pair of electrodes of the light-emitting element 240, which is connected to the driving transistor 236.

As a typical manufacturing method of an element which constitutes a logic circuit, a manufacturing method of a CMOS (an n-channel transistor 200 and a p-channel transistor 202) is described. In addition, as a typical manufacturing method of an element which constitutes a driver circuit, a manufacturing method of a CMOS (an n-channel transistor 204 and a p-channel transistor 206) is described.

The manufacturing methods of the logic circuit and the driver circuit are described with reference to FIGS. 13A to 16B, while the manufacturing method of the pixel is described with reference to FIGS. 17A to 20B. Note that a substrate over which the logic circuit and the driver circuit are formed is the same as the substrate over which the pixel is formed; therefore, the substrate is denoted by a common reference numeral in FIGS. 13A to 16B and FIGS. 17A to 20B. In addition, common portions are denoted by common reference numerals in FIGS. 13A to 16B and FIGS. 17A to 20B.

Figure 13A:
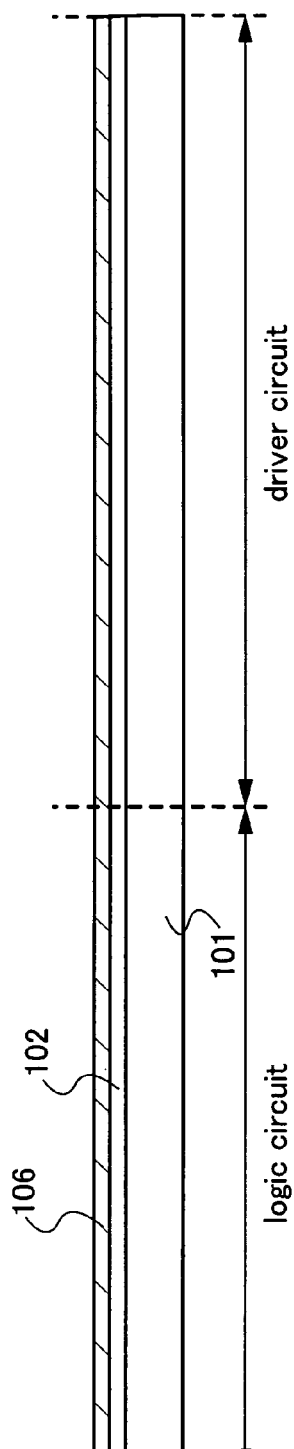
FIGS. 13A to 13C illustrate a manufacturing process of a semiconductor device in accordance with Embodiment Mode 8.

A base insulating layer 102 is formed over a substrate 101. An amorphous semiconductor layer is formed over the base insulating layer 102, and then the amorphous semiconductor layer is crystallized to form a semiconductor layer 106 (FIGS. 13A and 17A). For the crystallization of the amorphous semiconductor layer, any of the following methods can be used: laser crystallization, thermal crystallization by RTA or by use of an annealing furnace, thermal crystallization using metal elements which promote crystallization, or a combination with these.

The crystallization method using thermal treatment may be combined with a crystallization method using laser beam irradiation with a continuous wave laser or a pulsed laser with a repetition rate of 10 MHz or more. By irradiation with laser beams with the use of a continuous wave laser or a pulsed laser with a repetition rate of 10 MHz or more, the surface of the crystallized semiconductor layer can be planarized. Accordingly, an insulating layer (gate insulating layer) formed over the crystalline semiconductor layer can be formed thin, which can improve the withstand voltage of the gate insulating layer.

The substrate 101 may be a glass substrate such as barium borosilicate glass, alumino borosilicate glass, or aluminosilicate glass, a quartz substrate, a ceramic substrate, or the like. Alternatively, a semiconductor substrate having a surface formed with an insulating layer may be used as well. A substrate formed of a flexible synthetic resin such as plastic may be used as well. The surface of the substrate may be planarized by polishing such as CMP. Alternatively, a substrate obtained by polishing and thinning a glass substrate, a quartz substrate, or a semiconductor substrate may be used as well.

The base insulating layer 102 may be an insulating layer formed of silicon oxide, silicon nitride, silicon nitride oxide, or the like. The base insulating layer 102 can prevent diffusion of alkaline metals such as Na and alkaline earth metals contained in the substrate 101 into a semiconductor layer which serves as an active layer of a transistor, which would otherwise adversely affect the characteristics of the transistor. The base insulating layer 102 may have either a single-layer structure or a stacked-layer structure of two or more layers. Note that if the diffusion of impurities is not of a big concern in the case of using a quartz substrate, for example, the base insulating layer 102 is not necessarily required.

The surface of the substrate 101 may be directly treated by high-density plasma treatment as well. High-density plasma is generated with microwaves, for example, waves with a frequency of 2.45 GHz. Note that as the high-density plasma, plasma with an electron density of $1 \times 10^{11}$ to $5 \times 10^{13}/cm^3$, an electron temperature of 2 eV or less, and an ion energy of 5 eV or less is used here. In this manner, since the high-density plasma which has a feature in its low electron temperature has low kinetic energy of activated species, a less defective film with little plasma damage can be formed as compared to that formed by the conventional plasma treatment. The surface of the substrate 101 can be nitrided by performing the aforementioned high-density plasma treatment under a nitrogen atmosphere, for example, an atmosphere containing nitrogen ($N_2$) and a rare gas (at least one of He, Ne, Ar, Kr, and Xe), an atmosphere containing nitrogen, hydrogen ($H_2$), and a rare gas, or an atmosphere containing ammonia ($NH_3$) and a rare gas. In the case of using glass, quartz, a silicon wafer, or the like for the substrate 101, a nitride layer formed on the surface of the substrate 101 has silicon nitride as a main component; therefore, it can be utilized as a blocking layer against impurities which are diffused from the substrate 101. A silicon oxide film or a silicon oxynitride film may further be formed over this nitride layer by plasma CVD so as to form the base insulating layer 102.

In addition, by performing similar high-density plasma treatment to the surface of the base insulating layer 102 formed of silicon oxide or silicon oxynitride, the surface of the base insulating layer 102 can be nitrided, though a depth of 1 to 10 nm. For example, after forming a silicon nitride oxide film ($SiN_xO_y$) (x>y) as the base insulating layer 102, and performing plasma treatment to the silicon nitride oxide film in an atmosphere containing nitrogen, the surface of the silicon nitride oxide film can be nitrided, and after that a silicon oxynitride film ($SiO_xN_y$) (x>y) is stacked over the silicon nitride oxide film. In general, a silicon nitride oxide film formed by CVD or sputtering has defects inside the film, and thus is not sufficient in film quality. Therefore, by nitriding the silicon nitride oxide film by performing plasma treatment under a nitrogen atmosphere, the surface of the silicon nitride oxide film can be modified to obtain a denser film. As a result, it can be prevented that a semiconductor element formed over the substrate 101 is contaminated with impurity elements diffused from the substrate 101.

Figure 13B:
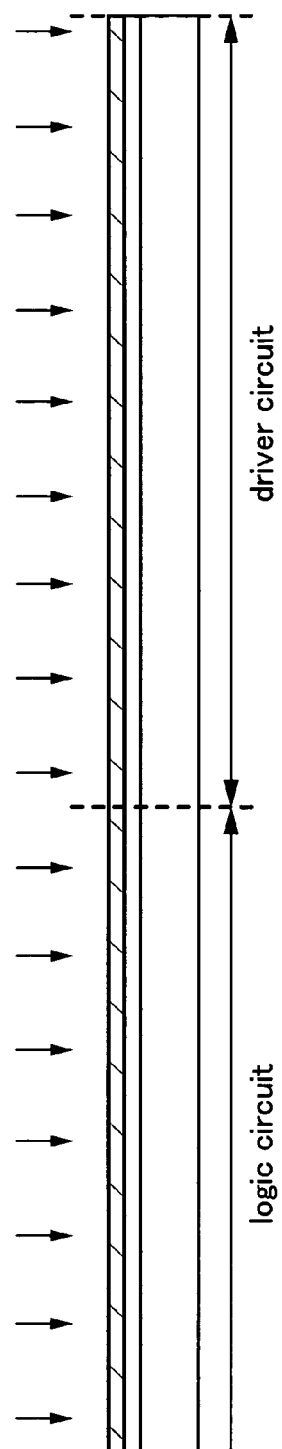

Next, the semiconductor layer 106 is doped with p-type impurity elements. Here, boron (B) is used as the impurity elements (FIGS. 13B and 17B). This doping is performed to a portion to become a channel formation region of a transistor, in order to control the threshold voltage of the transistor.

Figure 13C:
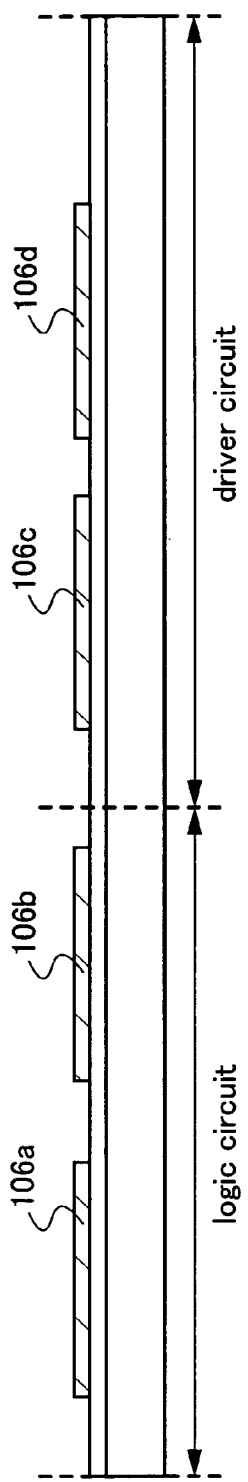

Next, the semiconductor layer 106 is selectively etched to form semiconductor layers 106a, 106b, 106c, and 106d, (FIG. 13C) and semiconductor layers 106a, 106b, and 106c (FIG. 17C). The semiconductor layers 106a and 106b in FIG. 13C are used for the logic circuit, the semiconductor layers 106c and 106d in FIG. 13C are used for the driver circuit, and the semiconductor layers 106a, 106b, and 106c in FIG. 17C are used for the pixel.

Next, by oxidizing or nitriding the semiconductor layers 106a, 106b, 106c, and 106d by plasma treatment, a plasma-oxidized layer 134 is formed on the surface of each semiconductor layer (FIGS. 14A and 18A). Here, the plasma-oxidized layer 134 is formed by performing plasma treatment in an atmosphere containing oxygen, thereby oxidizing the semiconductor layers 106a, 106b, 106c, and 106d. The plasma-oxidized layer 134 is preferably silicon oxide ($SiO_x$) or silicon oxynitride ($SiO_xN_y$) (x>y). Since this reaction is a solid-phase reaction, the interface state density between the plasma-oxidized layer 134 and the semiconductor layer can be controlled extremely low. In general, a silicon oxide film or a silicon oxynitride film formed by CVD or sputtering has defects inside the film, and thus is not sufficient in film quality. To the contrary, an insulating layer which is obtained by oxidizing the surface of a semiconductor layer by performing high-density plasma treatment in an oxygen atmosphere can have higher density than an insulating layer formed by CVD or sputtering. In addition, in the case of providing a conductive layer over the semiconductor layer by CVD or sputtering, with the insulating layer interposed therebetween, there is a possibility that coverage defects such as breaking of the insulating layer is caused at an edge of the semiconductor layer. However, by oxidizing or nitriding the surface of the semiconductor layer by plasma treatment in advance, coverage defects of the insulating layer at an edge of the semiconductor layer can be prevented. Further, since such high-density plasma treatment directly oxidizes (or nitrides) the semiconductor layer (crystalline silicon or polycrystalline silicon), thickness variations of the insulating layer to be formed can be ideally made extremely small. In addition, since it can be prevented that the oxidation progresses more than necessary at a crystal grain boundary of polycrystalline silicon, an excellent state can be obtained. That is, by solid-phase oxidizing the surface of the semiconductor layer by the high-density plasma treatment shown herein, it can be prevented that an abnormal oxidation reaction occurs at the crystal grain boundary, and thus a uniform insulating layer with a low interface state density can be formed.

Gate insulating layers of the n-channel transistor 200 and the p-channel transistor 202 are formed by using only the plasma-oxidized layer 134 which is formed by high-density plasma treatment. On the other hand, gate insulating layers of the n-channel transistor 204, the p-channel transistor 206, the switching transistor 234, and the driving transistor 236 are formed by using a stack of the plasma-oxidized layer 134 formed by high-density plasma treatment with the plasma-oxidized layer 134 such as silicon oxide, silicon oxynitride, or silicon nitride which is deposited by CVD using plasma or thermal reaction. In any case, a transistor having a gate insulating layer, a part or all of which is formed with the plasma-oxidized layer 134 formed by high-density plasma treatment, can be reduced in variations of characteristics. Further, the capacitor 238 utilizes the plasma-oxidized layer 124 formed by high-density plasma treatment as a dielectric layer. The plasma-oxidized layer 134 is a dense film formed with a thickness of 1 to 15 nm, or preferably 5 to 10 nm; therefore, the capacitor 238 can be formed with high capacity.

In addition, a semiconductor layer, which is obtained by crystallizing a semiconductor layer by irradiation with continuous wave laser beams or pulsed laser beams with a repetition rate of 10 MHz or more, while scanning in one direction, has a characteristic that crystals grow in the scan direction of the beams. By positioning a channel direction of a transistor (a direction in which carriers flow when a channel is formed) along with the scan direction, and combining it with the aforementioned gate insulating layer, such a transistor can be obtained that has small variations in characteristics and has high electron field-effect mobility.

Next, a first conductive layer 158 and a second conductive layer 160 are deposited so as to cover the plasma-oxidized layer 134 and the base insulating layer 102 (FIGS. 14B and 18B). The first conductive layer 158 may be formed with tantalum nitride, while the second conductive layer 160 may be formed with tungsten. The materials of the first conductive layer 158 and the second conductive layer 160 are not limited to the aforementioned, and any of the following materials can be used: elements selected from among tantalum (Ta), tungsten (W), titanium (Ti), molybdenum (Mo), aluminum (Al), copper (Cu), chromium (Cr), niobium (Nb), or the like, or an alloy or compound material containing such elements as a main component. In addition, the first conductive layer 158 and the second conductive layer 160 may be formed with a semiconductor material typified by polycrystalline silicon doped with impurity elements such as phosphorus.

The first conductive layer 158 and the second conductive layer 160 are etched to form a gate electrode 174 composed of a first conductive layer 158a and a second conductive layer 160a, a gate electrode 176 composed of a first conductive layer 158b and a second conductive layer 160b, and a capacitor electrode 208 composed of a first conductive layer 158d and a second conductive layer 160b (FIGS. 14C and 18C). In addition, a gate electrode 210 can be formed concurrently with the formation of these conductive layers.

These conductive layers can be formed by using a photomask or a reticle including an auxiliary pattern which is formed of a diffraction grating pattern or a semi-transmissive film having a function of reducing the light intensity. That is, the quantity of light that the photomask transmits is controlled in exposing the photoresist to light in the photolithography step. In this manner, a resist mask developed can be formed to have a thick portion, a thin portion than that, and an opening. In the method using a diffraction grating pattern, a photomask or a reticle is provided with slits with a resolution limit or less, so that a resist mask with the complex shape is formed. After the development, baking may be performed at a temperature of about 200° C., so that the mask pattern formed of the photoresist material is transformed. By etching the first conductive layer 158 and the second conductive layer 160 with the resist mask, the gate electrode 174, the gate electrode 176, and the capacitor electrode 208 can be formed. In this manner, a region where only the first conductive layer is formed, and a region where both of the first conductive layer and the second conductive layer are stacked can be continuously formed with one photomask.

That is, a gate insulating layer of a transistor which operates with a driving voltage of 5 V or less, or preferably less than 3 V is formed with a thickness of about 10 to 15 nm. In order to provide a low concentration impurity region in an n-channel transistor having a channel length of 0.2 to 1 μm, the width of the first conductive layer 158a (width of the channel direction) is formed larger than that of the second conductive layer 160a. A region where the first conductive layer 158a is projects from the second conductive layer 160a, may be formed on one side of a drain, so that a low concentration impurity region is formed in a self-aligned manner in the subsequent step. The width of the projection is preferably 0.1 to 0.5 μm.

Next, an insulating layer 178 is formed over the gate electrode 174, the gate electrode 176, and the capacitor electrode 208, so as to cover the plasma-oxidized layer 134, and the base insulating layer 102. A third conductive layer 180 is formed so as to cover the insulating layer 178. A fourth conductive layer 182 is formed so as to cover the third conductive layer 180 (FIGS. 15A and 19A).

The insulating layer 178 may be formed with a silicon oxide ($SiO_x$) film, a silicon nitride ($SiN_x$) film, or a silicon nitride oxide ($SiN_xO_y$, where x>y) film which is deposited by CVD (plasma CVD or thermal CVD).

The third conductive layer 180 may be formed with tantalum nitride, while the fourth conductive layer 182 may be formed with tungsten. The materials of the third conductive layer 180 and the fourth conductive layer 182 are not limited to the aforementioned, and any of the following materials can be used: elements selected from among tantalum (Ta), tungsten (W), titanium (Ti), molybdenum (Mo), aluminum (Al), copper (Cu), chromium (Cr), niobium (Nb), or the like, or an alloy or compound material containing such elements as a main component. In addition, the third conductive layer 180 and the fourth conductive layer 182 may be formed with a semiconductor material typified by polycrystalline silicon doped with impurity elements such as phosphorus.

The third conductive layer 180 and the fourth conductive layer 182 are etched to form a gate electrode 184 composed of a third conductive layer 180a and a fourth conductive layer 182a, a gate electrode 186 composed of a third conductive layer 180b and a fourth conductive layer 182b, a gate electrode 210 composed of a third conductive layer 180c and a fourth conductive layer 182c, and a gate electrode 212 composed of a third conductive layer 180d and a fourth conductive layer 182d (FIGS. 15B and 19B).

These conductive layers can be formed by using a photomask or a reticle including an auxiliary pattern which is formed of a diffraction grating pattern or a semi-transmissive film having a function of reducing the light intensity. That is, the quantity of light that the photomask transmits is controlled in exposing the photoresist to light in the photolithography step. In this manner, a resist mask developed can be formed to have a thick portion, a thin portion than that, and an opening. In the method using a diffraction grating pattern, a photomask or a reticle is provided with slits with a resolution limit or less, so that a resist mask with the complex shape is formed. After the development, baking may be performed at a temperature of about 200° C., so that the mask pattern formed of the photoresist material is transformed. By etching the third conductive layer and the fourth conductive layer with the resist mask, the gate electrodes 184, 186, 210, and 212 can be formed. In this manner, a region where only the third conductive layer is formed, and a region where both of the third conductive layer and the fourth conductive layer are stacked can be continuously formed with one photomask.

Next, a mask 188 is formed covering the semiconductor layers 106b and 106d (FIG. 15C), and the semiconductor layers 106b and 106c (FIG. 19C). The semiconductor layers 106a and 106c (FIG. 15C), and 106a (FIG. 19C) are doped with n-type impurity elements (here, phosphorus (P) is shown as an example), by using the gate electrodes 174, 184, and 210 as masks. A portion where both of the first conductive layer and the second conductive layer are formed is doped with few n-type impurity elements. In a portion where neither the first conductive layer nor the second conductive layer is formed, a region doped with n-type impurity elements (hereinafter referred to as an impurity region) is formed. A portion where the first conductive layer is formed but the second conductive layer is not formed is doped with n-type impurity elements through the first conductive layer; therefore a region which is doped with n-type impurity elements at a lower concentration than the aforementioned impurity region (hereinafter referred to as a low concentration impurity region or an LDD region) is formed. The first conductive layer is formed thinner than the second conductive layer. The first conductive layer is formed with a thickness enough for ion species, which are accelerated with an electric field of 10 to 100 kV, to pass through. A portion where both of the third conductive layer and the fourth conductive layer are formed is doped with few n-type impurity elements. In a portion where neither the third conductive layer nor the fourth conductive layer is formed, a region doped with n-type impurity elements (hereinafter referred to as an impurity region) is formed. A portion where the third conductive layer is formed but the fourth conductive layer is not formed is doped with n-type impurity elements through the third conductive layer; therefore, a region which is doped with n-type impurity elements at a lower concentration than the aforementioned impurity region (hereinafter referred to as a low concentration impurity region or an LDD region) is formed. The third conductive layer is formed thinner than the fourth conductive layer. The third conductive layer is formed with a thickness enough for ion species, which are accelerated with an electric field of 10 to 100 kV, to pass through.

In this manner, an n-type impurity region 190a and a low concentration impurity region 192 are formed in the semiconductor layer 106a (FIG. 15C). An n-type impurity region 190b and a low concentration impurity region 194 are formed in the semiconductor layer 106c (FIG. 15C). An n-type impurity region 214 and a low concentration impurity region 216 are formed in the semiconductor layer 106a (FIG. 19C). Each of the low concentration impurity regions is formed so as to overlap with the first conductive layer, thereby forming an LDD region which overlaps with the gate electrode. By the manufacturing method in this embodiment mode, an LDD region which overlaps with a gate electrode can be formed in a self-aligned manner.

That is, in an n-channel transistor of a driver circuit which is operated with a driving a voltage not higher than 5, or preferably less than 3 V, a gate insulating layer is formed with a thickness of 10 to 120 nm, or preferably 10 to 90 nm, a channel region is formed with a length of 0.2 to 8 μm, or preferably 0.52 to 3 μm, and a low concentration impurity region is only required to be provided on one side of a drain. Meanwhile, in an n-channel transistor of a pixel, there may be a case where the polarity (conductivity) of a source and a drain are reversed; therefore, the third conductive layer 180c and the fourth conductive layer 182c are etched so that low concentration region regions are formed in a self-aligned manner on opposite sides of gate electrodes. In this case, gate electrodes of the respective transistors can be formed to have different cross-sectional shapes by using a photomask or a leticle including the aforementioned auxiliary pattern which is formed of a diffraction grating pattern or a semi-transmissive film having a function of reducing the light intensity. In addition, although a wire (gate wire) formed in the same layer as the gate electrode, while being connected thereto is not required to be processed into the shape of an eave, it can be subjected to light exposure at once if it is formed by using a photomask or a leticle including an auxiliary pattern which is formed of a diffraction grating pattern or a semi-transmissive film having a function of reducing the light intensity.

Next, after removing the mask 188, a mask 196 is formed covering the semiconductor layer 106a and the semiconductor layer 106c (FIG. 15D) and the semiconductor layer 106a (FIG. 19D). The semiconductor layers 106a and 106d (FIG. 15D) and the semiconductor layers 106b and 106c (FIG. 19D) are doped with p-type impurities impurity elements (here, boron (B) is shown as an example), by using the gate electrodes 176, 186, and 212, and the capacitor electrode 208 as masks. A portion where both of the first conductive layer and the second conductive layer are formed is doped with few p-type impurity elements. In a portion where neither the first conductive layer nor the second conductive layer is formed, a region doped with p-type impurity elements (an impurity region) is formed. A portion where both of the third conductive layer and the fourth conductive layer are formed is doped with few p-type impurity elements. In a portion where neither the third conductive layer nor the fourth conductive layer is formed, a region doped with p-type impurity elements (an impurity region) is formed. A portion where the third conductive layer is formed but the fourth conductive layer is not formed is doped with p-type impurity elements through the third conductive layer; therefore, a region which is doped with p-type impurity elements at a lower concentration than the aforementioned impurity region (low concentration impurity region or an LDD region) is formed. The third conductive layer is formed thinner than the fourth conductive layer. The third conductive layer is formed with a thickness enough for ion species, which are accelerated with an electric field of 10 to 100 kV, to pass through.

In this manner, a p-type impurity region 198a is formed in the semiconductor layer 106b (FIG. 15D). A p-type impurity region 198b is formed in the semiconductor layer 106d (FIG. 15D). A p-type impurity region 218 is formed in the semiconductor layer 106b (FIG. 19D). A p-type impurity region 220 and a low concentration impurity region 222 are formed in the semiconductor layer 106c (FIG. 19D).

Figure 20A:
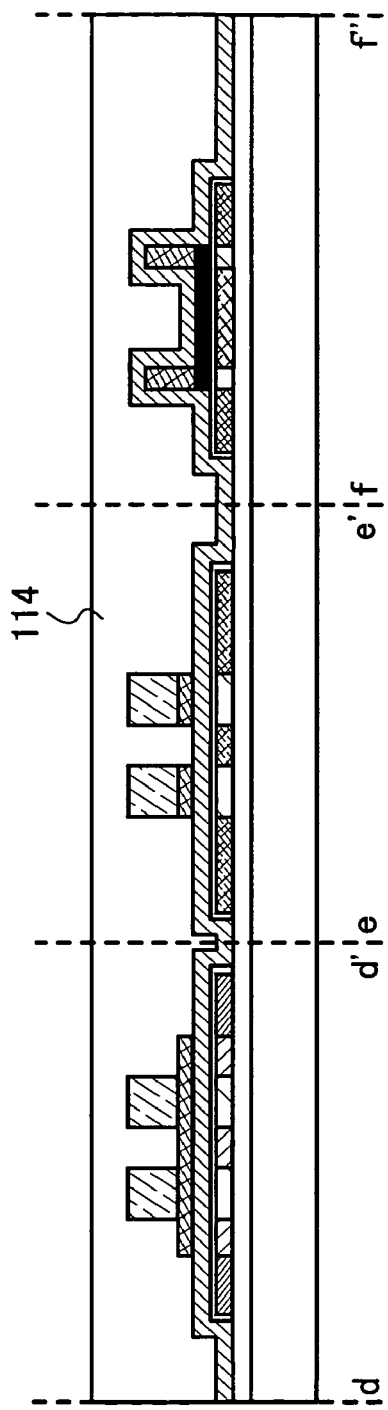
FIGS. 20A and 20B illustrate a manufacturing process of a semiconductor device in accordance with Embodiment Mode 8.

Next, an interlayer insulating layer 114 is formed so as to cover the gate electrodes 184, 186, 210 and 212, or the insulating layer 178 (FIGS. 16A and 20A).

The interlayer insulating layer 114 can be formed to have a single-layer structure or stacked-layer structure of an inorganic insulating layer or an organic insulating layer. The inorganic insulating layer includes a silicon oxide film formed by CVD, a silicon oxide film formed by SOG (Spin On Glass), and the like, while the organic insulating layer includes a film made of polyimide, polyamide, BCB (benzocyclobutene), acrylic, a positive photosensitive organic resin, or a negative photosensitive organic resin.

The interlayer insulating layer 114 may also be formed with a material having a skeletal structure with a bond of silicon (Si) and oxygen (O). As a substituent of such a material, an organic group containing at least hydrogen (e.g., an alkyl group or aromatic hydrocarbon) is used. Alternatively, a fluoro group may be used as the substituent or both a fluoro group and an organic group containing hydrogen may be used as the substituent.

Figure 20B:
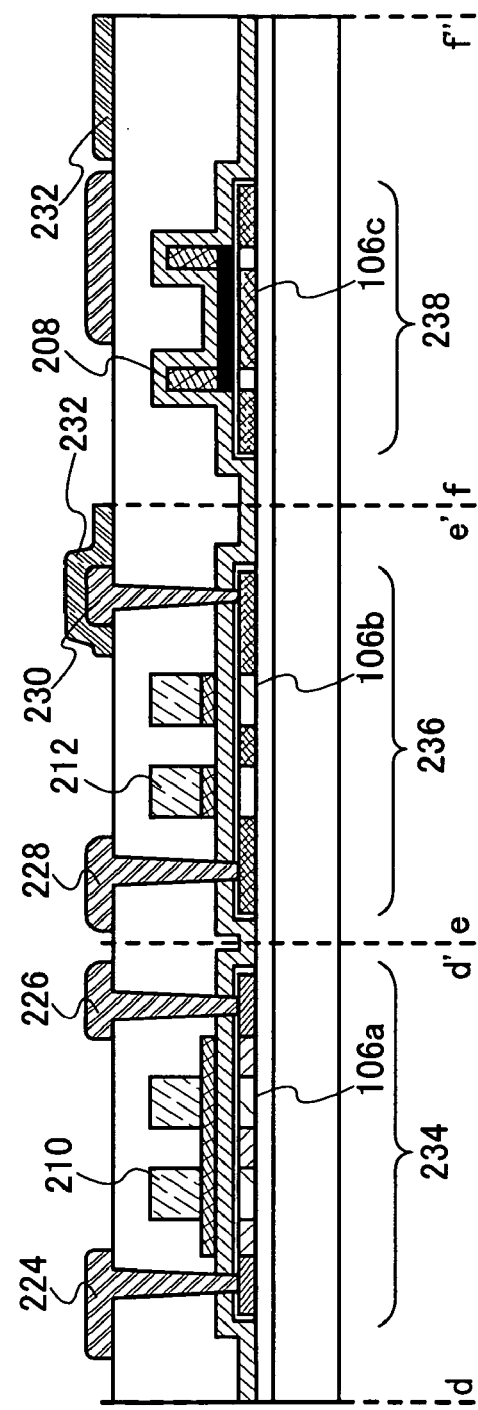

Next, contact holes are formed in the interlayer insulating layer 114 to reach the impurity regions. A conductive layer is formed on the contact holes and then patterned into a wire 116, a signal line 224, a wire 226, a power supply line 228, and a wire 230. Further, a pixel electrode 232 is formed in contact with the wire 230 (FIGS. 16B and 20B).

The wire 116, the signal line 224, the wire 226, the power supply line 228, and the wire 230 can be formed using one or more metals selected from among copper (Cu), aluminum (Al), silver (Ag), gold (Au), chromium (Cr), a molybdenum (Mo), titanium (Ti), tantalum (Ta), tungsten (W), nickel (Ni), and carbon (C), or a metal compound thereof.

The pixel electrode 232 can be formed with indium oxide containing tungsten oxide, indium zinc oxide containing tungsten oxide, indium tin oxide containing titanium oxide, indium tin oxide containing titanium oxide, or the like. Needless to say, indium tin oxide (ITO), indium zinc oxide, indium tin oxide doped with silicon oxide, or the like may be used as well.

As described above, the n-channel transistor 200, the p-channel transistor 202, the n-channel transistor 204, the p-channel transistor 206, the switching transistor 234, the driving transistor 236, and the capacitor 238 can be formed.

FIG. 12B is a top view of a pixel with the configuration shown in FIG. 12A. Cross sections along lines d-d', e-e', and f-f' in FIG. 12B correspond to FIG. 20B.

In forming the semiconductor layers 106a, 106b, 106c, and 106d, the first conductive layer (e.g., the first conductive layer 158a or the like), the second conductive layer (e.g., the second conductive layer 160a or the like), the third conductive layer (e.g., the third conductive layer 180a or the like), the fourth conductive layer (e.g., the fourth conductive layer 182a or the like), the wire 116, and the wire which is formed by patterning concurrently with the pixel electrode 232, each wire layer is formed to have such a pattern that a corner that is a right triangle at an L-shaped edge is removed with the condition that one side of the removed triangle is not longer than 10 μm, or not shorter than one-fifth of the width of the wire layer, while being not longer than half of the width of the wire layer, so that the edge is rounded. That is to say, the outer circumference of the corner of the wire layer is curved when seen from the above. Specifically, in order to form the outer circumference of the corner to be roundish, a part of the wire layer is removed, which corresponds to a right-angled isosceles triangle having two first straight lines which make a right angle with each other to form an edge, and a second straight line which makes an angle of about 45 degrees with the two first straight lines. After removing the triangle, two obtuse angles are formed in the remaining wire layer. Thus, it is preferable to etch the wire layer by appropriately adjusting the mask design or etching conditions so as to form curved lines in contact with the respective first straight lines and the second straight line, in the obtuse angle portions. Note that each length of the two sides of the right-angled isosceles triangle, which are equal to each other, is not shorter than one-fifth and not longer than half of the width of the wire layer. In addition, the inner circumference of the corner is also made roundish along with the outer circumference of the corner. By forming a corner of a projecting portion to be roundish, generation of particulates due to overdischarge can be suppressed in dry etching with plasma. By forming a corner in a depressed portion to be roundish, such an effect can be obtained that, even when particulates are generated in washing, they can be washed away without gathering in the corner. Thus, yields can be significantly improved.

By the manufacturing method shown in this embodiment mode, gate insulating layers of the CMOS in the logic circuit (the n-channel transistor 200 and the p-channel transistor 202) can be formed thinner than those in the CMOS in the driver circuit (the n-channel transistor 204 and the p-channel transistor 206). In general, a voltage amplitude of signals to be processed is smaller in the logic circuit than in the driver circuit of the pixel. Since the gate insulating layers of the transistors, to which signals with a small voltage amplitude is input, can be formed thin in accordance with the manufacturing method in this embodiment mode, a plurality of circuits can be formed over a common insulating surface in such a manner that elements are formed to have corresponding functions required for the respective circuits.

In addition, the p-channel transistor 202 of the CMOS in the logic circuit manufactured by the manufacturing method in this embodiment mode is not provided with a low concentration impurity region (an LDD region). Meanwhile, in the n-channel transistor 200 of the CMOS in the logic circuit, the n-channel transistor 204 of the CMOS in the driver circuit, and the n-channel switching transistor 234 in the pixel, a low concentration impurity region (an LDD region) can be provided in the channel direction (direction in which carriers flow) in a position overlapping with either one or both of sidewalls provided on side surfaces of the gate electrode. Since only an n-channel transistor which would have significant hot electron degradation can be provided with an LDD region which suppresses such degradation, a plurality of circuits can be formed over a common insulating surface in such a manner that elements are formed to have corresponding functions required for the respective circuits.

The dielectric layer of the capacitor 238 can be formed thin. In addition, by doping the capacitor 238 with impurity elements which impart conductivity type through the first conductive layer 158d, a part of the semiconductor layer 106c overlapping with the first conductive layer 158d can be reduced in resistance. Such doping is preferable in order for the semiconductor layer 106c partially overlapping with the first conductive layer 158d to function as one of a pair of the electrodes of the capacitor 238. Further, by utilizing the second conductive layer 160d as an auxiliary electrode, the first conductive layer 158d can fully function as an electrode even when formed thin.

As described above, elements having suitable structures for the respective circuits can be formed by the method of forming pixels, a driver circuit for driving the pixels, and a logic circuit over a common insulating surface. Thus, a device with high performance and high reliability can be provided.

In the case of downsizing a field effect transistor (an n-type transistor is assumed here) within such a level that does not cause a short channel effect with the condition that a gate insulating layer is formed with a thickness of 10 to 120 nm, or preferably 10 to 90 nm, and a channel is formed with a length of 0.2 to 8 µm, or preferably 0.52 to 3 µm, and providing a low concentration impurity (LDD) region so as to overlap with a gate electrode, the overlapped ratio can be freely designed in accordance with the driving voltage. As for a shift register and/or a logic circuit which is operated with a driving voltage of 1.5 to 6 V, or preferably 3 to 5 V, a low concentration impurity region can be provided so as to overlap with a gate electrode by a length of 0.2 to 1 µm. As for a transistor which operates with a voltage higher than the above but not higher than 20 V, and typically in the range of 8 to 18 V, a low concentration impurity region can be provided so as to overlap with a gate electrode by a length of 1 to 5 µm.

In addition, layout design of wires can be carried out without restriction of the shape of a gate electrode. Accordingly, a pixel portion and a logic circuit (and further, a logic circuit) can be formed over a common substrate in such a manner that transistors with different design rules are formed in the respective circuit blocks. Thus, an area of portions other than the pixel portion (area including the driver circuit, lead wires, and the like) can be reduced, thereby an area of a frame region of the display panel can be reduced.

This embodiment mode can be applied to a display device using electroluminescent elements (EL display device) or a liquid crystal device using an electro-optic function of liquid crystals.

EMBODIMENT MODE 9

In this embodiment mode, description is made of a digital camera, a computer, an image reproducing device provided with a recording medium (specifically, a device for reproducing a recording medium such as a digital versatile disc (DVD) and having a display portion for displaying the reproduced image), a television set, and a mobile phone, in accordance with the invention with reference to FIGS. 21A to 21D and 22.

Figure 21A:
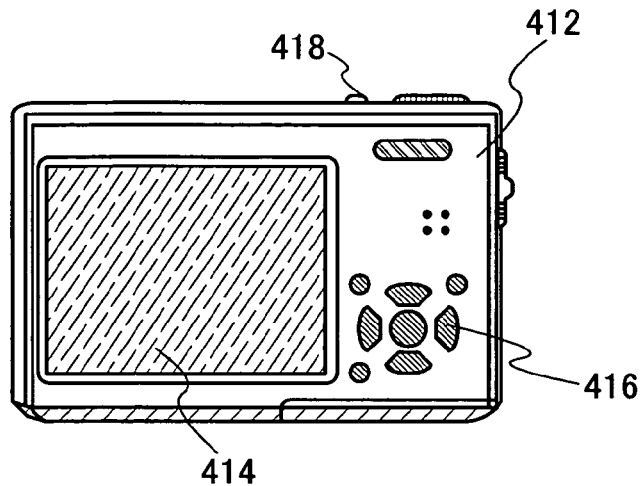
FIGS. 21A to 21D illustrate exemplary electronic devices.

FIG. 21A shows a digital camera which includes a main body 412, a display portion 414, an image pickup portion, an operating key 416, a shutter 418, and the like. Note that FIG. 21A is a view seen from the side of the display portion 414; therefore, the image pickup portion is not shown. According to the invention, a highly reliable digital camera having a display portion with a high aperture ratio and high resolution can be realized.

Figure 21B:
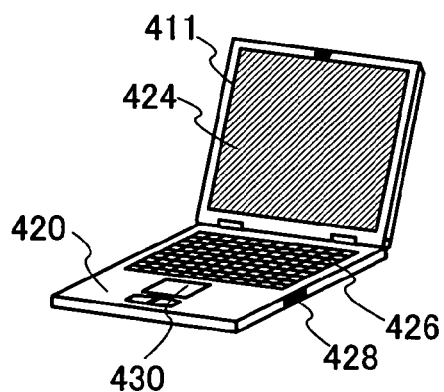

FIG. 21B shows a computer which includes a main body 420, a housing 411, a display portion 424, a keyboard 426, an external connecting port 428, a pointing mouse 430, and the like. According to the invention, a highly reliable computer a having a display portion with a high aperture ratio and high resolution can be realized.

Figure 21C:
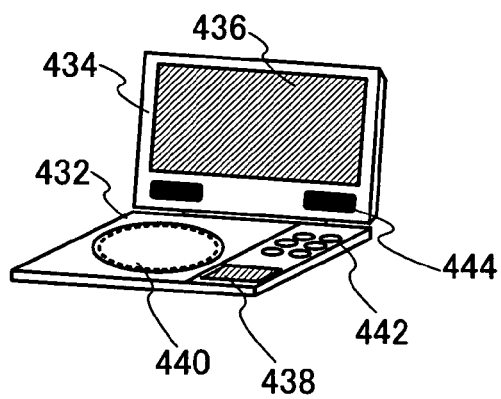

FIG. 21C shows a portable image reproducing device provided with a recording medium (specifically, a DVD reproducing device) which includes a main body 432, a housing 434, a display portion A 436, a display portion B 438, a recording medium reading portion 440 (e.g., a DVD or the like), an operating key 442, a speaker portion 444, and the like. The display portion A 436 mainly displays image data, while the display portion B 438 mainly displays text data. Note that the image reproducing device provided with a recording medium includes a home-use game machine and the like. According to the invention, a highly reliable image reproducing device having a display portion with a high aperture ratio and high resolution can be realized.

Figure 21D:
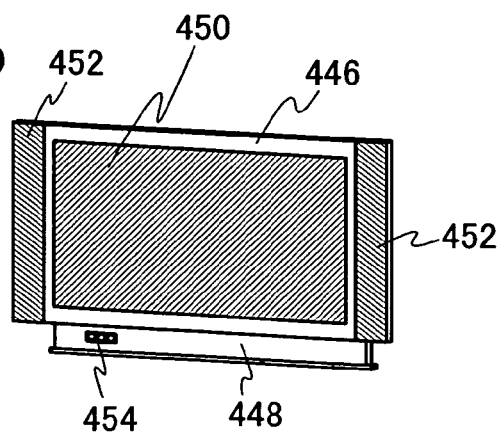

FIG. 21D shows a television set which includes a housing 446, a supporting base 448, a display portion 450, speakers 452, a video input terminal 454, and the like. This display device is manufactured by using transistors formed in accordance with the manufacturing method shown in the aforementioned embodiment modes for the display portion 450 and a driver circuit thereof. Specifically, the display device includes all display devices for information display such as those for computers, television broadcasting reception, and advertisement display. According to the invention, a highly reliable display device having a display portion with a high aperture ratio and high resolution can be realized. In particular, a large display device with a large display screen with a size of 22 inches to 50 inches can be realized.

Figure 22:
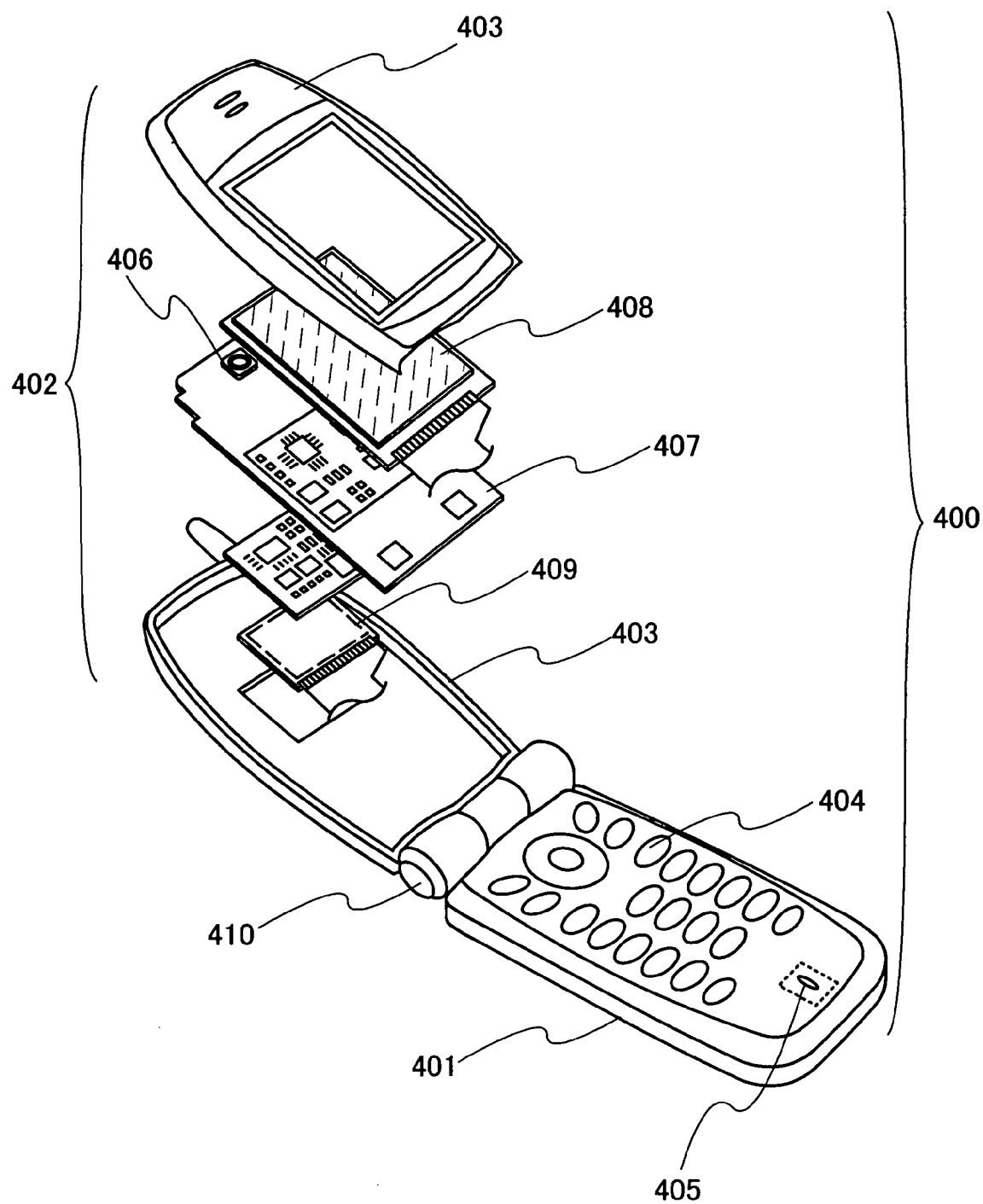
FIG. 22 illustrates an exemplary electronic device.

A mobile phone shown in FIG. 22 includes a main body (A) 401 having operating switches 404, a microphone 405, and the like, and a main body (B) 402 having a display panel (A) 408, a display panel (B) 409, a speaker 406, and the like. The main body (A) 401 is connected to the main body (B) 402 with a hinge 410 so as to be opened or closed. The main body (A) 401 and the main body (B) 402 are incorporated into housings 403 together with a circuit board 407. Pixel portions of the display panel (A) 408 and the display panel (B) 409 are disposed so as to be seen from windows formed in the housing 403.

The specification of each of the display panel (A) 408 and the display panel (B) 409 such as the number of pixels can be set appropriately in accordance with the function of the mobile phone 400. For example, the display panel (A) 408 can be used as a main display screen, while the display panel (B) 409 can be used as a sub-display screen.

According to the invention, a highly reliable portable information terminal having a display portion with a high aperture ratio and high resolution can be realized.

The mobile phone in accordance with this embodiment mode can be changed into various styles in accordance with the function or intended use. For example, a camera-equipped mobile phone can be constructed by incorporating an image pickup device into the hinge 410. In addition, even when the operating switches 404, the display panel (A) 408, and the display panel (B) 409 are incorporated into one housing, the aforementioned advantageous effects can be provided. Further, a similar effect can be obtained even when the mobile phone is applied to an information display terminal having a plurality of display portions.

As descried above, various electronic devices can be completed by using the manufacturing method or the structure in accordance with any of Embodiment Modes 1 to 8.

The present application is based on Japanese Priority application No. 2005-162308 filed on Jun. 2, 2005 with the Japanese Patent Office, the entire contents of which are hereby incorporated by reference.

What is claimed is:

1. A manufacturing method of a semiconductor device, comprising:
    crystallizing a semiconductor layer with a laser selected from the group consisting of a continuous wave laser and a pulsed laser with a repetition rate of 10 MHz to 100 GHz;
    forming a first insulating layer on the semiconductor layer after crystallizing the semiconductor layer by oxidation treatment with the use of oxygen radicals produced by plasma with an electron temperature of 3 eV or less and an electron density of $1\times10^{11}$ cm$^{-3}$ or more;
    forming a first conductive layer over the first insulating layer;
    etching the first conductive layer by using a first mask pattern which is intentionally formed to have a portion with a nonuniform thickness and a second mask pattern which is formed to have a uniform thickness by using a photomask or a reticle including an auxiliary pattern having a function of reducing the light intensity;
    forming a second insulating layer over the first conductive layer after etching the first conductive layer;
    forming a second conductive layer over the second insulating layer;
    etching the second conductive layer;
    forming a third insulating layer over the second conductive layer after etching the second conductive layer; and
    etching the first insulating layer, the second insulating layer and the third insulating layer to form a contact hole reaching the semiconductor layer.

2. The manufacturing method of a semiconductor device according to claim 1, wherein the auxiliary pattern is formed of a semi-transmissive film.

3. The manufacturing method of a semiconductor device according to claim 1, wherein the auxiliary pattern is formed of a diffraction grating pattern.

4. A manufacturing method of a semiconductor device, comprising:
    crystallizing a semiconductor layer with a laser selected from the group consisting of a continuous wave laser and a pulsed laser with a repetition rate of 10 MHz to 100 GHz;
    forming a first insulating layer on the semiconductor layer after crystallizing the semiconductor layer by nitridation treatment with the use of nitrogen radicals produced by plasma with an electron temperature of 3 eV or less and an electron density of $1\times10^{11}$ cm$^{-3}$ or more;
    forming a first conductive layer over the first insulating layer;
    etching the first conductive layer by using a first mask pattern which is intentionally formed to have a portion with a nonuniform thickness and a second mask pattern which is formed to have a uniform thickness by using a photomask or a reticle including an auxiliary pattern having a function of reducing the light intensity;
    forming a second insulating layer over the first conductive layer after etching the first conductive layer;
    forming a second conductive layer over the second insulating layer;
    etching the second conductive layer;
    forming a third insulating layer over the second conductive layer after etching the second conductive layer; and
    etching the first insulating layer, the second insulating layer and the third insulating layer to form a contact hole reaching the semiconductor layer.

5. The manufacturing method of a semiconductor device according to claim 4, wherein the auxiliary pattern is formed of a semi-transmissive film.

6. The manufacturing method of a semiconductor device according to claim 4, wherein the auxiliary pattern is formed of a diffraction grating pattern.

7. A manufacturing method of a semiconductor device, comprising:
    crystallizing a semiconductor layer with a laser selected from the group consisting of a continuous wave laser and a pulsed laser with a repetition rate of 10 MHz to 100 GHz;
    forming a first insulating layer on the semiconductor layer after crystallizing the semiconductor layer by oxidation treatment with the use of oxygen radicals produced by plasma with an electron temperature of 3 eV or less and an electron density of $1\times10^{11}$ cm$^{-3}$ or more;
    forming a first conductive layer over the first insulating layer;
    etching the first conductive layer;
    forming a second insulating layer over the first conductive layer;
    forming a second conductive layer over the second insulating layer;
    etching the second conductive layer by using a first mask pattern which is intentionally formed to have a portion with a nonuniform thickness and a second mask pattern which is formed to have a uniform thickness by using a photomask or a reticle including an auxiliary pattern having a function of reducing the light intensity;
    forming a third insulating layer over the second conductive layer after etching the second conductive layer; and
    etching the first insulating layer, the second insulating layer and the third insulating layer to form a contact hole reaching the semiconductor layer.

8. The manufacturing method of a semiconductor device according to claim 7, wherein forming the first insulating layer and depositing the second insulating layer are continuously performed without exposure to air.

9. The manufacturing method of a semiconductor device according to claim 7, wherein the auxiliary pattern is formed of a semi-transmissive film.

10. The manufacturing method of a semiconductor device according to claim 7, wherein the auxiliary pattern is formed of a diffraction grating pattern.

11. A manufacturing method of a semiconductor device, comprising:

crystallizing a semiconductor layer with a laser selected from the group consisting of a continuous wave laser and a pulsed laser with a repetition rate of 10 MHz to 100 GHz;

forming a first insulating layer on the semiconductor layer after crystallizing the semiconductor layer by nitridation treatment with the use of nitrogen radicals produced by plasma with an electron temperature of 3 eV or less and an electron density of $1 \times 10^{11}$ cm$^{-3}$ or more;

forming a first conductive layer over the first insulating layer;

etching the first conductive layer;

forming a second insulating layer over the first conductive layer;

forming a second conductive layer over the second insulating layer;

etching the second conductive layer by using a first mask pattern which is intentionally formed to have a portion with a nonuniform thickness and a second mask pattern which is formed to have a uniform thickness by using a photomask or a reticle including an auxiliary pattern having a function of reducing the light intensity;

forming a third insulating layer over the second conductive layer after etching the second conductive layer; and etching the first insulating layer, the second insulating layer and the third insulating layer to form a contact hole reaching the semiconductor layer.

12. The manufacturing method of a semiconductor device according to claim 11, wherein forming the first insulating layer and depositing the second insulating layer are continuously performed without exposure to air.

13. The manufacturing method of a semiconductor device according to claim 11, wherein the auxiliary pattern is formed of a semi-transmissive film.

14. The manufacturing method of a semiconductor device according to claim 11, wherein the auxiliary pattern is formed of a diffraction grating pattern.

* * * * *